(12) United States Patent
Takahashi

(10) Patent No.: US 6,903,405 B2
(45) Date of Patent: Jun. 7, 2005

(54) SEMICONDUCTOR MEMORY DEVICE WITH A PAIR OF FLOATING GATES

(75) Inventor: Koji Takahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 11 days.

(21) Appl. No.: 10/349,948

(22) Filed: Jan. 24, 2003

(65) Prior Publication Data

US 2003/0178671 A1 Sep. 25, 2003

(30) Foreign Application Priority Data

Mar. 20, 2002 (JP) ........................................ 2002-079615

(51) Int. Cl.[7] .............................................. H01L 29/76
(52) U.S. Cl. ........................ 257/314; 257/315; 257/317
(58) Field of Search ................................. 257/314, 315, 257/316, 317, 321, 324

(56) References Cited

U.S. PATENT DOCUMENTS

| 6,093,945 A | * | 7/2000 | Yang ........................... 257/317 |
| 6,329,687 B1 | * | 12/2001 | Sobek et al. ................. 257/314 |
| 2002/0040992 A1 | * | 4/2002 | Manabe et al. ............. 257/314 |

FOREIGN PATENT DOCUMENTS

| JP | 5-48113 | 2/1993 |
| JP | 5-152579 | 6/1993 |
| JP | 2626523 | 4/1997 |

* cited by examiner

*Primary Examiner*—Hoai Pham
(74) *Attorney, Agent, or Firm*—Westerman, Hattori, Daniels & Adrian, LLP

(57) ABSTRACT

A floating gate is provided in the form of two separated parts in one memory cell to allow each of the floating gates to be individually programmable, thereby enabling the integration to be doubled in the same memory cell as compared to the case in which a single floating gate is provided.

4 Claims, 28 Drawing Sheets

SEMICONDUCTOR MEMORY DEVICE WITH A PAIR OF FLOATING GATES

CROSS-REFERENCE TO RELATED APPLICATIONS

This application is based upon and claims the benefit of priority from the prior Japanese Patent Application No. 2002-79615, filed on Mar. 20, 2002, the entire contents of which are incorporated herein by reference.

BACKGROUND OF THE INVENTION

1. Field of the Invention

The present invention relates to a semiconductor memory device and a manufacturing method thereof which are, in particular, preferably applied to a non-volatile memory having a floating gate.

2. Description of the Related Art

Memory ICs having a function of storing information thereon include non-volatile memories as memory ICs that keep storing the information even when their power sources are cut off. Further, there are, as rewritable non-volatile memories, EPROMs which electrically write information and erase it by ultraviolet irradiation, EEPROMs which both write and erase electrically, and further flash memories which combine those advantages and so on, which are used in various applications.

Each of these rewritable non-volatile memories is provided with a floating gate to be able to perform write and erase by injecting and drawing carriers to and from the floating gate.

An example of a conventional non-volatile memory is explained here.

FIG. 28 to FIG. 30 show an example of a conventional NOR-type non-volatile memory. FIG. 28 shows its plan view, FIG. 29 shows an equivalent circuit diagram thereof, and FIG. 30 shows a schematic cross-sectional view of a memory cell between III and III shown in FIG. 28.

As shown in FIG. 28 and FIG. 29, in the conventional NOR-type non-volatile memory, memory cells 100 are formed at cross portions where word lines (WL1 to WL4) and bit lines (BL1 to BL4) cross each other at right angles, in which one floating gate 101 is disposed at each of the memory cells.

The word lines (WL1 to WL4) serve as control gates, the bit lines (BL1 to BL4) serve as drains, common source regions are provided between the word lines (WL1 to WL4), and one drain contact is provided for every two memory cells.

As shown in the schematic cross-sectional view in FIG. 30, in the conventional non-volatile memory, the floating gate 101 is formed above a Si substrate 102 through a silicon oxide film ($SiO_2$) 105. This floating gate 101 is disposed above a source 103 and a drain 104 to inject and draw carriers to and from the source 103 and the drain 104.

On the floating gate 101, an ONO film 106 and a control gate 107 are formed, thereby constituting a memory cell. The memory cell having the source 103 formed of an n-type diffusion layer with an LDD structure and the drain formed of an n-type diffusion layer with a single drain structure, is shown in this example.

In recent years, in order to increase the integration of the above-described non-volatile memory, improvements have been made in a direction of microfabrication in which the floating gate is formed in a complex three-dimensional structure or the like to increase the effective area of the floating gate, but such improvements actually have a limitation because of a limit on manufacturing such as a limit on light exposure or the like.

In addition, in the conventional NOR-type nonvolatile memory, since one drain contact is required for every two memory cells, a unit memory cell increases in area, giving rise to a problem that the memory cannot be increased in integration.

SUMMARY OF THE INVENTION

The present invention is made in consideration of the aforementioned problems, and its object is to realize a non-volatile semiconductor memory device with a simple structure and high integration.

The present inventor attained to aspects of the invention shown below as a result of earnest studies.

A semiconductor memory device of the present invention is characterized by including: a semiconductor substrate; a pair of diffusion layers formed, with a certain distance therebetween, in a surface of the semiconductor substrate; a first gate insulating film formed on the semiconductor substrate; a pair of floating gates formed, on the first gate insulating film, separately above the diffusion layers respectively; a second gate insulating film formed to cover the first gate insulating film and the floating gates including a concave portion between the pair of floating gates; and a control gate formed on the second gate insulating film, a memory cell being constituted for every the pair of floating gates.

A manufacturing method of a semiconductor memory device of the present invention is characterized by including the steps of: forming a first gate insulating film on a substrate; forming an island-shape insulating film on the first gate insulating film; forming a pair of first conductive layers on side walls of the island-shape insulating film; forming a pair of diffusion layers in a surface of the substrate at both sides of the island-shape insulating film; removing the island-shape insulating film; forming a second gate insulating film to cover the first conductive layers; and forming a second conductive layer on the second gate insulating film.

Since the present invention has the above-described technical means, it becomes possible to write, erase and read programs individually to and from the pair of floating gates which are separately provided in each of the memory cells, so that the storage amount can be doubled in the same occupied area of the memory cell as compared to the case in which a single floating gate is provided.

DETAILED DESCRIPTION OF THE PREFERRED EMBODIMENTS

Referring to the accompanying drawings, various embodiments on the basis of the primary principle of a semiconductor memory device and a manufacturing method of the same according to the present invention will be explained next.

First Embodiment

A semiconductor memory device in a first embodiment of the present invention is a NOR-type non-volatile memory.

Figure 1:
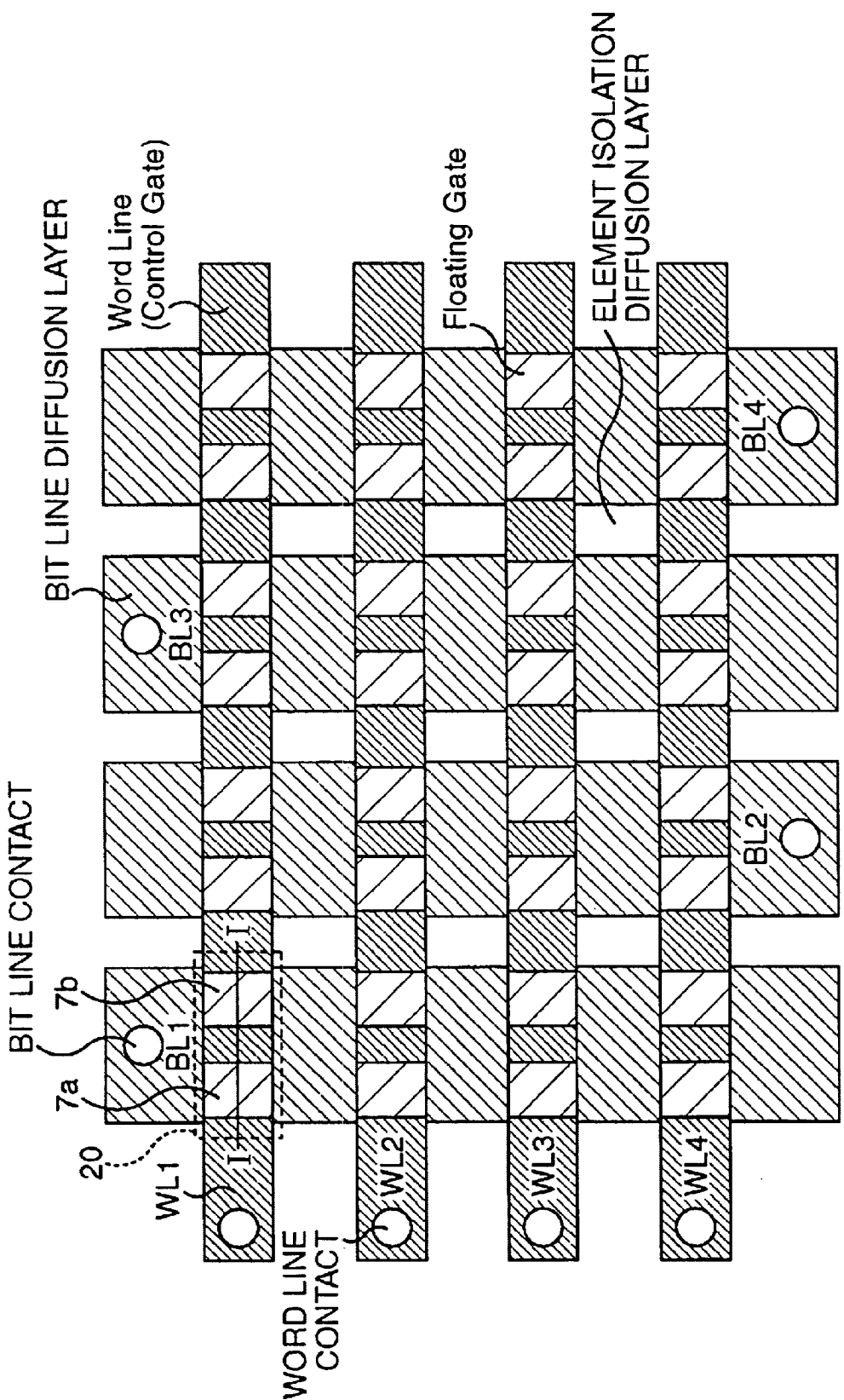
FIG. 1 is a plan view showing a semiconductor memory device of a first embodiment in the present invention.
Figure 2:
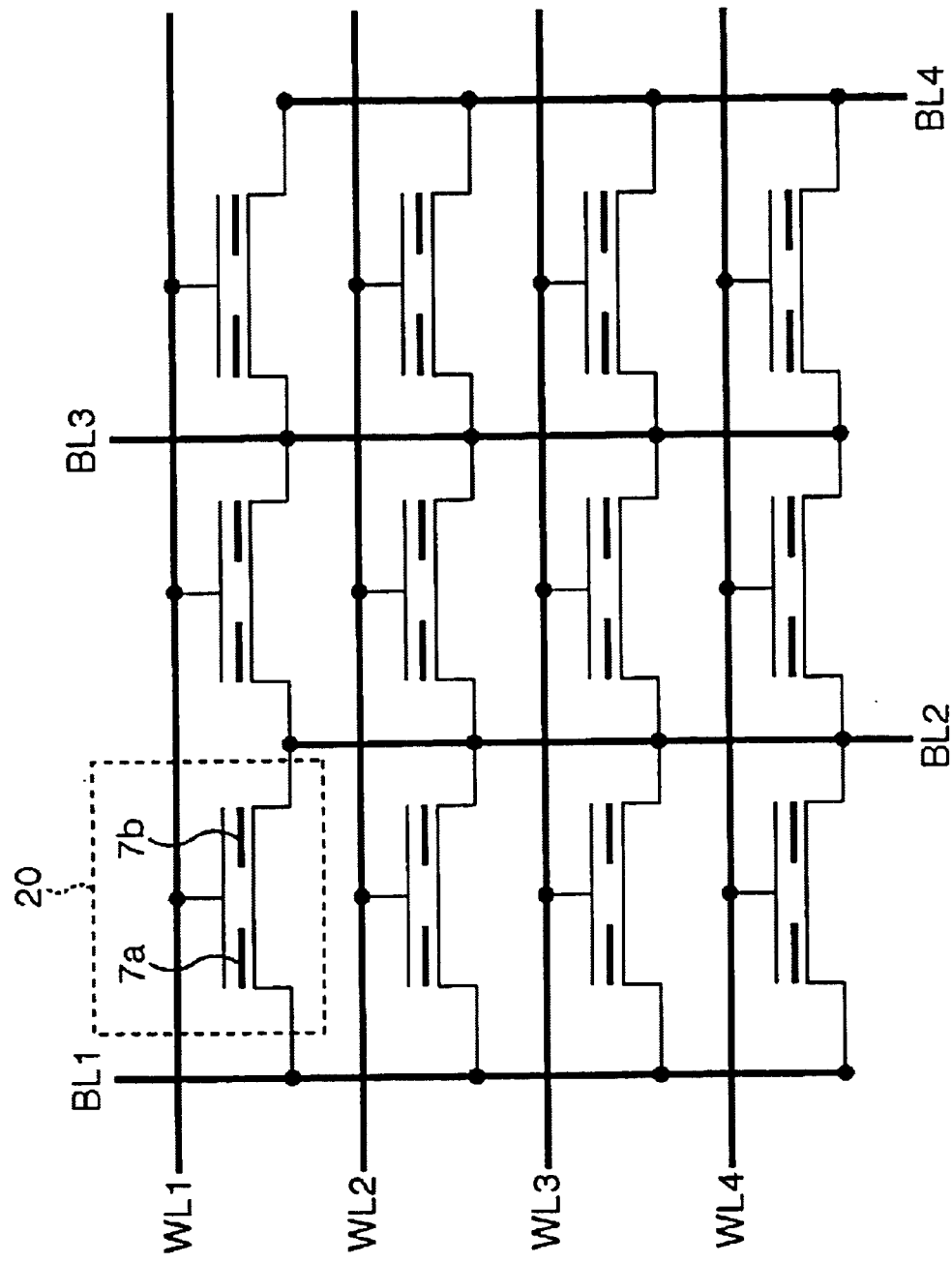
FIG. 2 is an equivalent circuit diagram showing the semiconductor memory device of the first embodiment in the present invention.

FIG. 1 i's a plan view of the semiconductor memory device according to the first embodiment, and FIG. 2 is an equivalent circuit diagram thereof. As shown in FIG. 1 and FIG. 2, in the semiconductor memory device, word lines (WL1 to WL4) corresponding to control gates and bit lines (BL1 to BL4) are formed to cross each other at right angles, and memory cells 20 are formed in a matrix form at cross portions of the word lines (WL1 to WL4) and the bit lines (BL1 to BL4).

Further, at regions surrounded by the word lines (WL1 to WL4) and the bit lines (BL1 to BL4), p-type element isolation diffusion layers are formed to define each of the memory cells 20. The bit lines (BL1 to BL4) are formed of n-type diffusion layers, and the bit lines (BL1 to BL4) and their peripheral circuit are wired using metal for a decrease in resistance.

Figure 3:
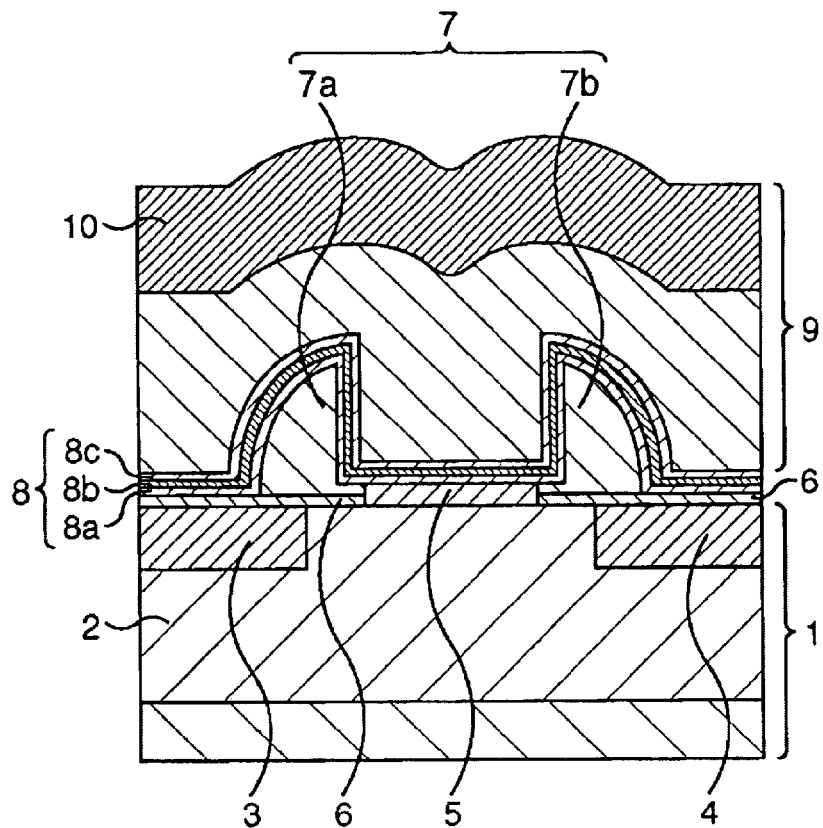
FIG. 3 is a schematic cross-sectional view showing the semiconductor memory device of the first embodiment in the present invention.

FIG. 3 shows a schematic cross-sectional view of the memory cell 20 between I and I shown in FIG. 1. As shown in FIG. 3, the memory cell 20 comprises: silicon oxide films ($SiO_2$ films) 5 and 6 as a gate insulating film formed on a Si substrate 1; a floating gate 7 formed of amorphous silicon (DASi) doped with an impurity such as phosphorus or the like on the silicon oxide films 6; an ONO film 8 formed to cover the floating gate 7 and the silicon oxide films 5 and 6; and a control gate 9, as a word line, which is formed of amorphous silicon (DASi) doped with an impurity such as phosphorus or the like on the ONO film 8 and is formed with a tungsten silicide (WSi) 10 at its upper layer.

The memory cell 20 of this embodiment is characterized in that the floating gate 7 is formed above a channel, separated into a pair of floating gates 7a and 7b. These separately formed floating gates 7a and 7b are disposed independently above a source 3 and a drain 4 respectively to be able to individually inject and draw electrons to and from the source 3 and the drain 4.

The pair of floating gates 7a and 7b are in the form of projecting above the center portion of the channel because they are side walls formed on inner walls of an insulating film which is formed on the silicon oxide films 6 and removed later.

Further, in the Si substrate 1, the source 3 and the drain 4 are formed of n-type diffusion layers in a p-type diffusion layer 2, and the source 3 and the drain 4 constitute the bit lines.

The silicon oxide film 5 is formed thicker than the silicon oxide films 6, thereby causing the floating gates 7a and 7b, which are formed as the side walls, to project more above the channel center portion to facilitate capture of electrons during programming. Further, constituting the silicon oxide film 5 of the silicon oxide films 6 is also included within the scope of this embodiment. The fabrication process of the silicon oxide film 5 can be simplified as described above.

Figure 4:
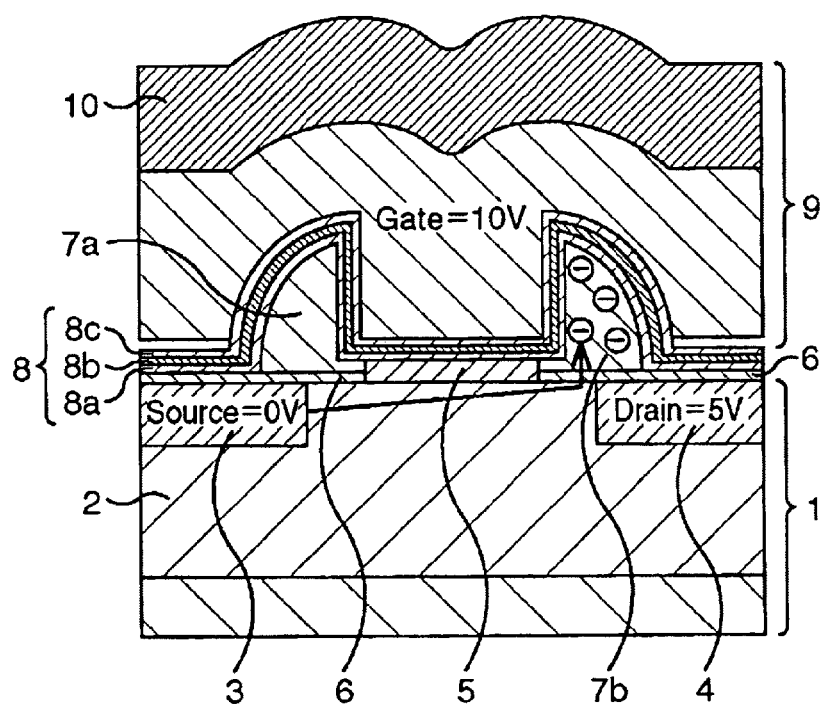
FIG. 4 is a schematic cross-sectional view showing a state of a program write operation of the semiconductor memory device in the present invention.
Figure 5:
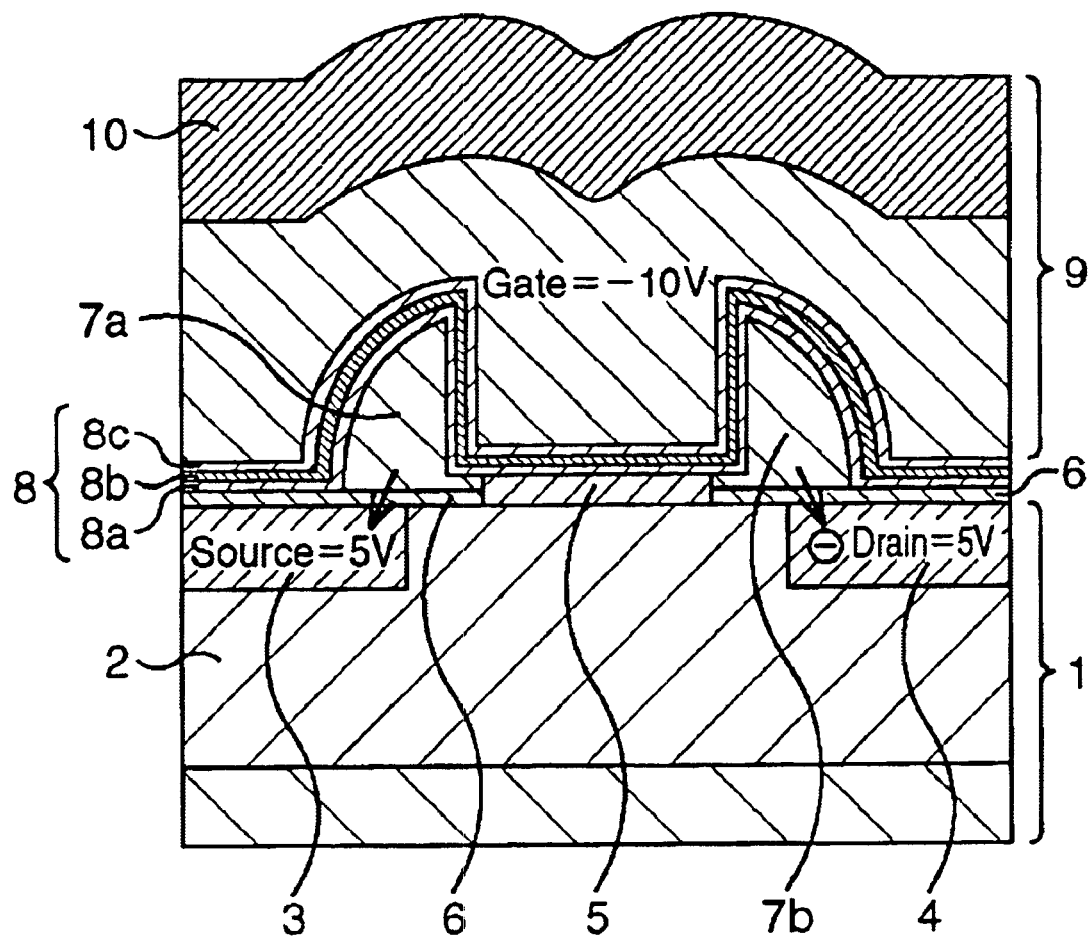
FIG. 5 is a schematic cross-sectional view showing a state of a program erase operation of the semiconductor memory device in the present invention.

Referring to FIG. 4 to FIG. 6, the basic operation of the semiconductor memory device of this embodiment is explained next.

FIG. 4 is a schematic cross-sectional view showing a state of a program write operation of the semiconductor memory device of this embodiment.

As shown in FIG. 4, for example, when the source 3 is grounded, a voltage of 5 V is applied to the drain 4, and a relatively high voltage such as a voltage of 10 V is applied to the control gate 9, electrons proceed through the channel from the source 3 to the drain 4. The electrons proceeding through the channel get high energy to become hot electrons in the vicinity of the drain 4, and part thereof jump over the silicon oxide film 6 and are injected into the floating gate 7b, whereby a write operation is performed.

While the write operation by the hot electrons is explained here as the write operation of this embodiment, electrons can also be injected from the drain 4 using an avalanche phenomenon by changing the voltage condition.

FIG. 5 is a schematic cross-sectional view showing a state of a program erase operation of the semiconductor memory device of this embodiment.

As shown in FIG. 5, for example, when voltages are applied under such a condition that a voltage of 5 V is applied to the source 3, a voltage of 5 V is applied to the drain 4, and a voltage of −10 V is applied to the control gate 9, electrons injected in the floating gate 7b are drawn into the drain 4 by FN (Fowler Nordheim) tunneling. In this event, when electrons are injected in the floating gate 7a, the electrons are drawn into the source 3.

While the erase operation by FN tunneling is explained here in this embodiment, the voltage condition can be changed to inject holes from the drain 4 or the source 3 using an avalanche phenomenon or inject holes by tunneling between bands, thereby canceling electrons for erase.

Figure 6A:
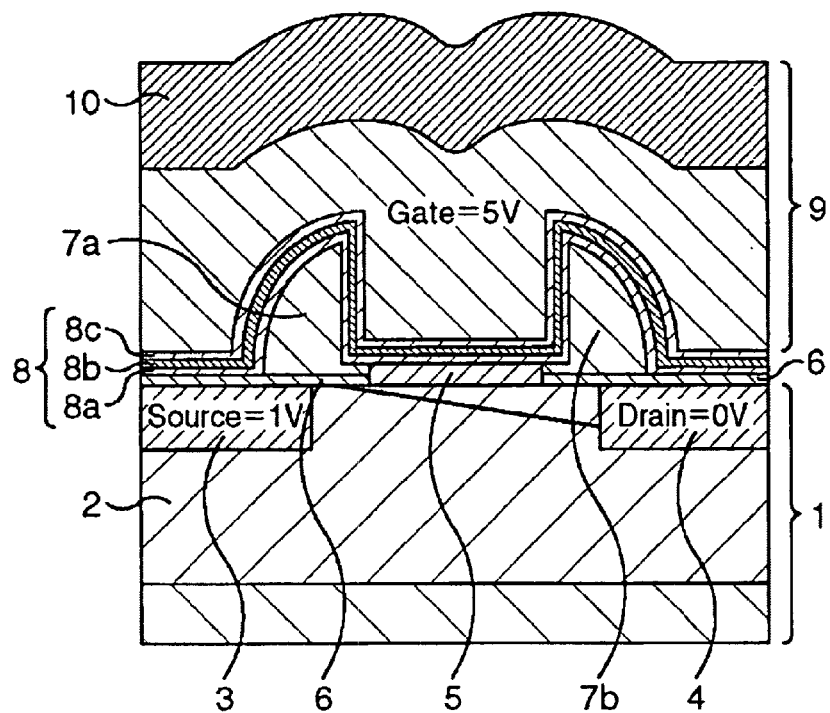
FIGS. 6A and 6B are schematic cross-sectional views showing a state of a program read operation of the semiconductor memory device in the present invention.
Figure 6B:
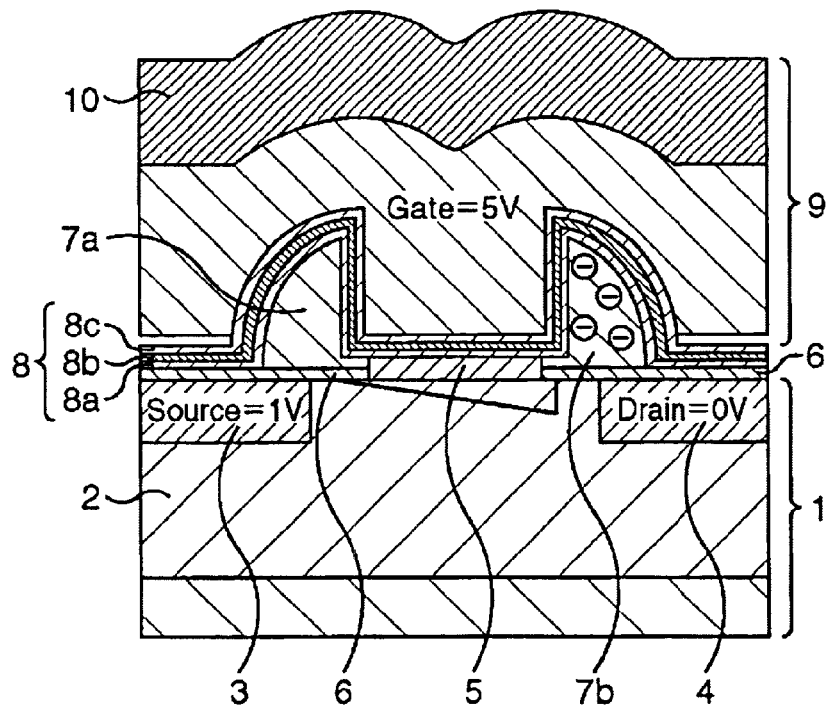

FIGS. 6A and 6B are schematic cross-sectional views each showing a state of a program read operation of the semiconductor memory device of this embodiment.

As shown in FIG. 6A, for example, when voltages are applied such that a voltage of 1 V is applied to the source 3, the drain 4 is grounded, and a voltage of 5 V is applied to the control gate 9, the channel is connected where there is no electron in the floating gates 7a and 7b, so that a current flows between the source 3 and the drain 4. The data in this state is read as "1".

On the other hand, as shown in FIG. 6B, the channel is cut where electrons are injected in the floating gate (7b in the case of FIG. 6B), so that no current flows between the source 3 and the drain 4. The data in this state is read as "0".

Figure 7:
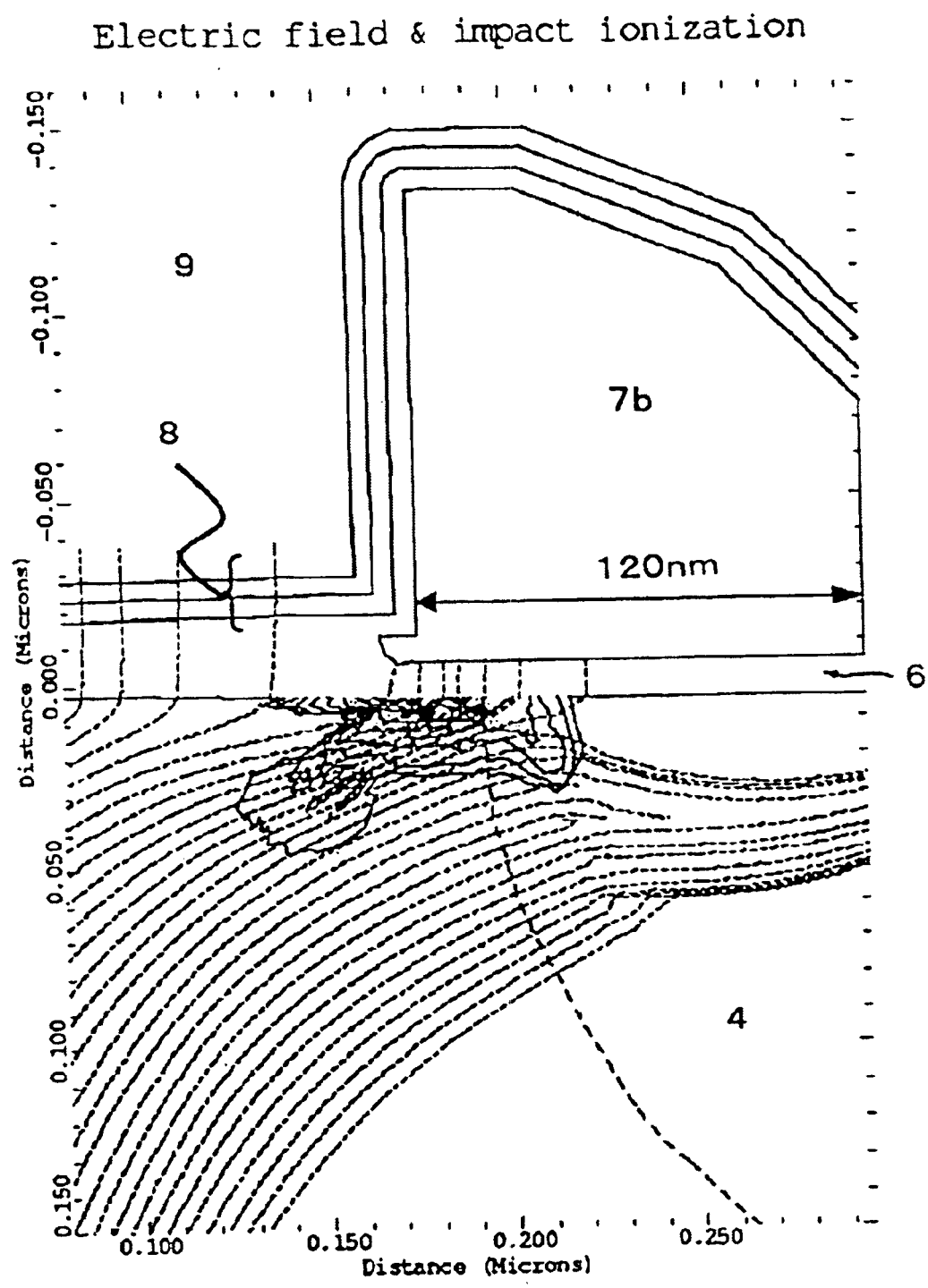
FIG. 7 is a schematic cross-sectional view showing TCAD verification results of the semiconductor memory device in the present invention.
Figure 8:
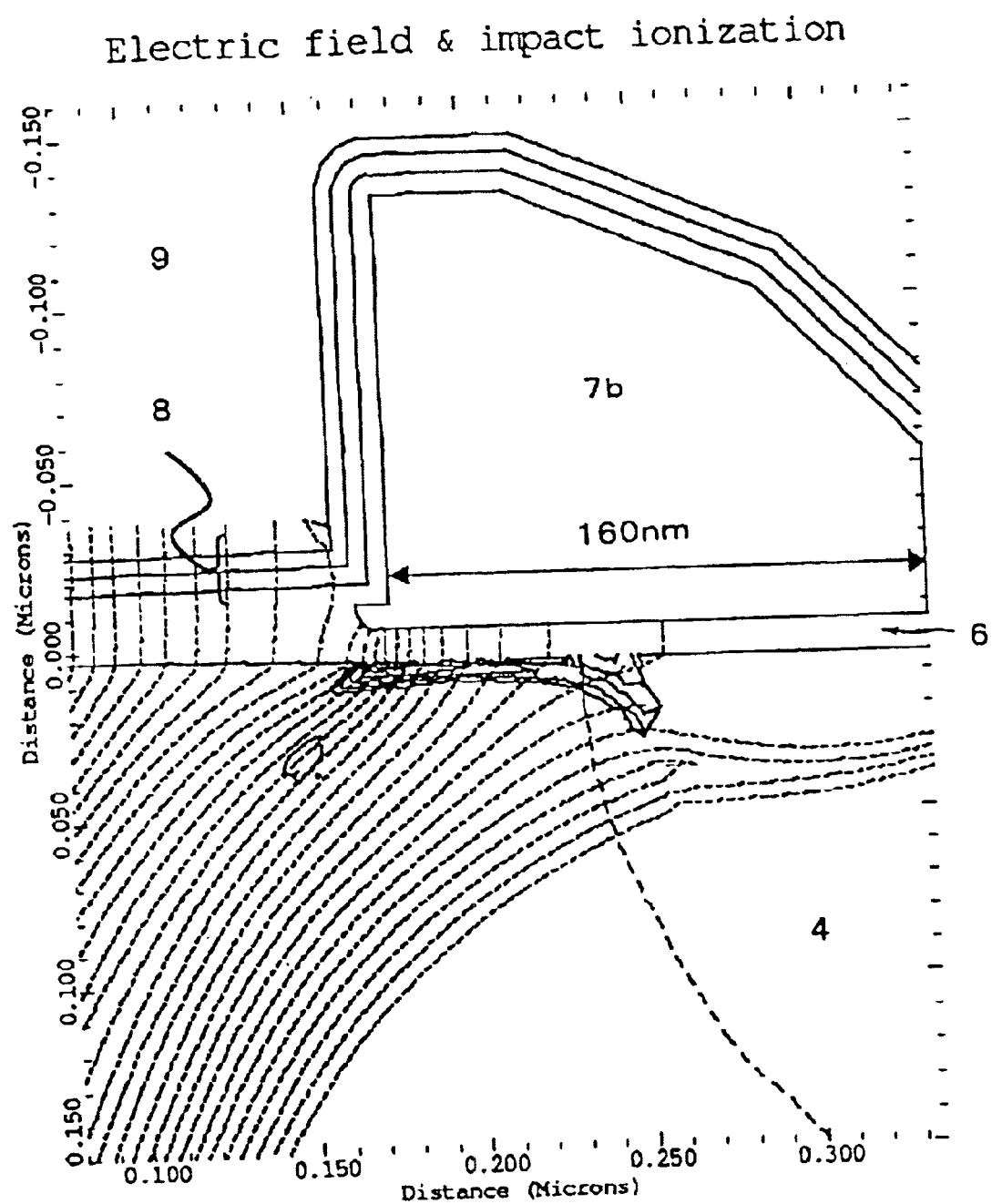
FIG. 8 is a schematic cross-sectional view showing TCAD verification results of the semiconductor memory device in the present invention.
Figure 9:
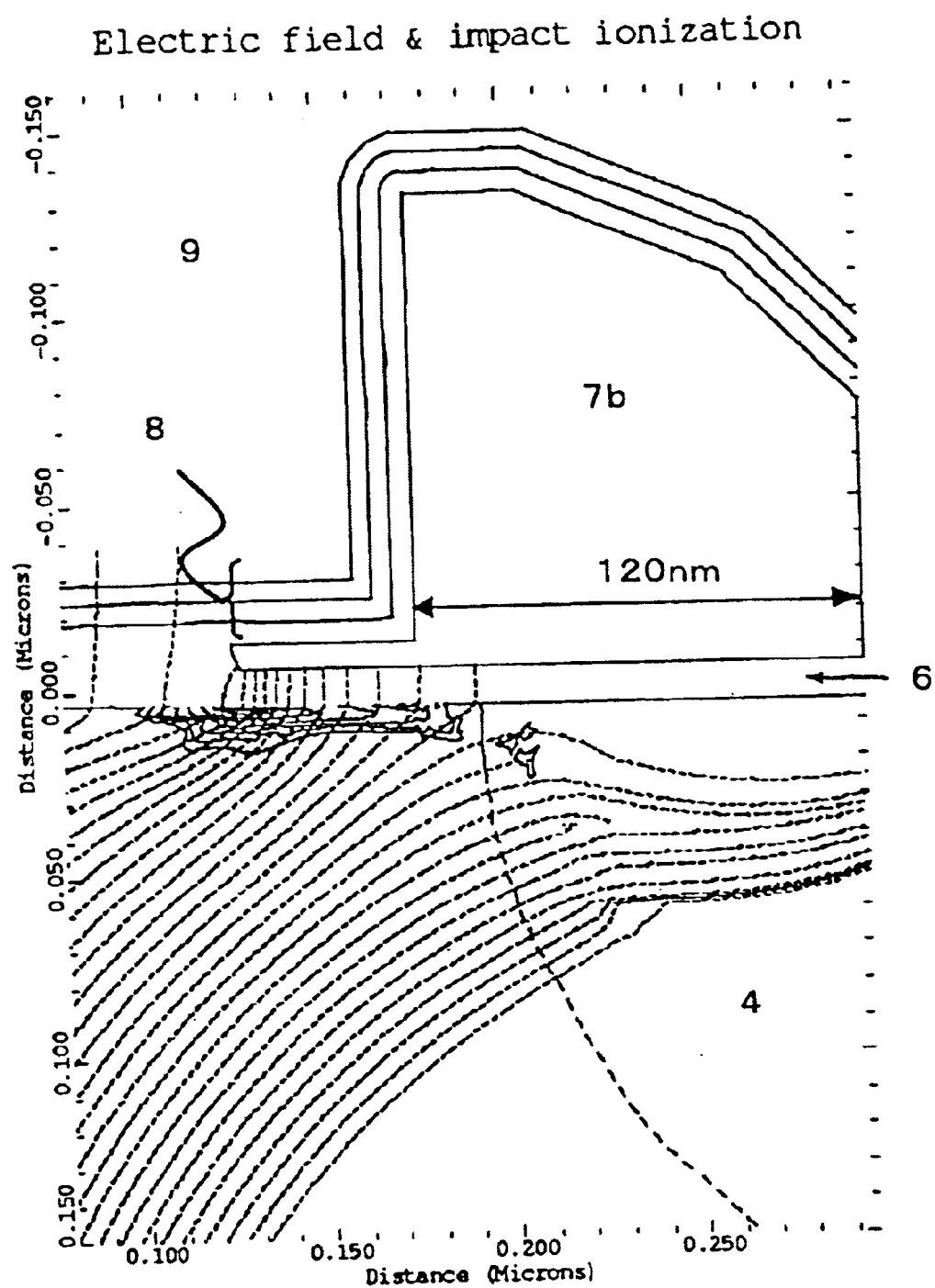
FIG. 9 is a schematic cross-sectional view showing TCAD verification results of the semiconductor memory device in the present invention.

Referring to FIG. 7 to FIG. 9, TCAD (Technology Computer Aided Design) verification results of the semiconductor memory device of this embodiment are explained next to verify effectiveness of the above-described basic operation.

FIG. 7 to FIG. 9 are schematic cross-sectional views showing TCAD verification results of the semiconductor memory device in the present invention and each showing a state of an electric field and impact ionization of carriers.

FIG. 7 is a schematic cross-sectional view showing TCAD verification results when the floating gate 7b of the semiconductor memory device in the present invention is 120 nm in width. From the verification results in FIG. 7, it is found that the impact ionization of carriers occurs under the floating gate 7b and the electric field is also directed to the floating gate 7b. This shows that programming is sufficiently possible.

In FIG. 8, the floating gate 7b is made larger in width than that of the semiconductor memory device in FIG. 7. From the verification results in FIG. 8, it is verified that the width of occurrence of the impact ionization of carriers can be made wider than that in the semiconductor memory device in FIG. 7. This is because the formation of the floating gate 7b wide in width allows an overlap surface thereof with the drain 4 being the n-type diffusion layer to increase in area. This shows that the program efficiency can be further improved.

In FIG. 9, a lower projecting portion of the floating gate 7b is made larger than that of the semiconductor memory device in FIG. 7 to increase, in area, an overlap surface thereof with the drain 4 being the n-type diffusion layer. From the verification results in FIG. 9, it is verified that the width of occurrence of the impact ionization of carriers can be increased without increasing the width of the floating gate 7b, which shows possibility of further improvement in program efficiency. That the program efficiency can be improved without increasing the floating gate 7b in width as described above is very effective for microfabrication of semiconductor memory devices.

MODIFIED EXAMPLE OF SEMICONDUCTOR MEMORY DEVICE

Figure 10:
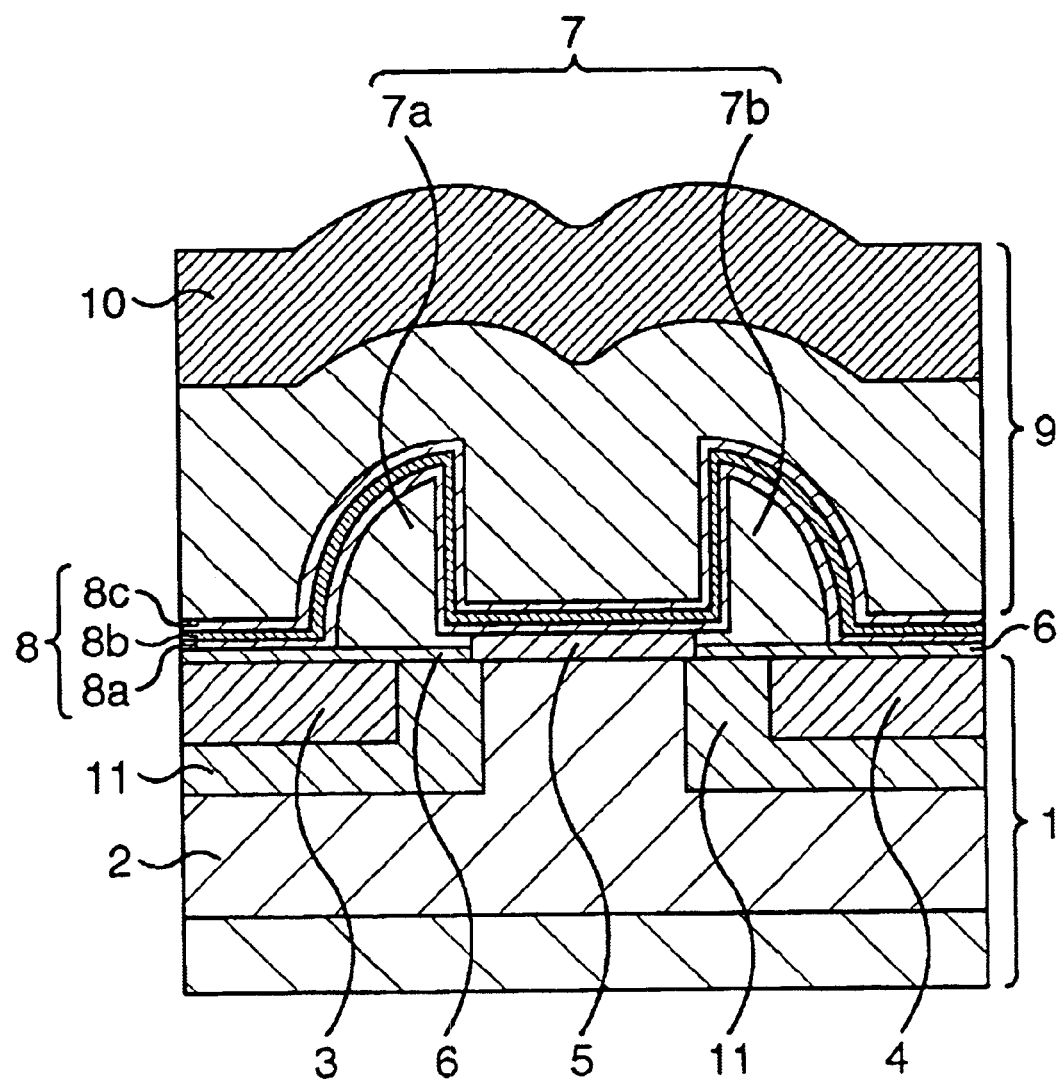
FIG. 10 is a schematic cross-sectional view showing a modified example of the semiconductor memory device of the first embodiment in the present invention.

FIG. 10 is a schematic cross-sectional view showing a modified example of the semiconductor memory device of this embodiment.

In the semiconductor memory device shown in FIG. 10, as compared to the semiconductor memory device shown in FIG. 3, p-type diffusion layers 11 are formed to cover the source 3 and the drain 4 which are composed of the n-type diffusion layers.

The layers having the opposite conduction type to those of the source 3 and the drain 4 are provided therearound as described above, thereby enabling measures against a punch through that respective depletion layers contact each other by a small drain-source voltage.

Manufacturing Method of Semiconductor Memory Device According to First Embodiment Hereinafter, a manufacturing method of the semiconductor memory device according to the first embodiment is explained.

FIGS. 11A to 11E through FIGS. 13A to 13C are schematic cross-sectional views showing, in order of processes, the manufacturing method of the semiconductor memory devices shown in FIG. 3 and FIG. 10.

Figure 11A:
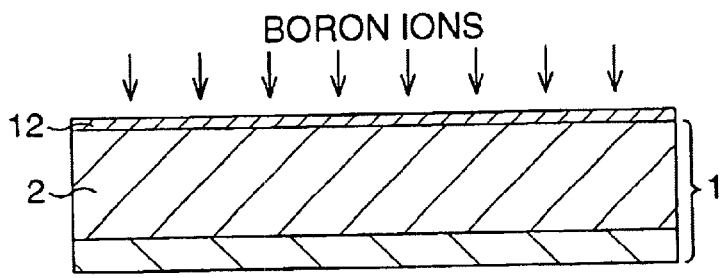
FIGS. 11A to 11E are schematic cross-sectional views showing, in order of processes, a manufacturing method of the semiconductor memory device according to the first embodiment.

First, as shown in FIG. 11A, the Si substrate 1 is thermally oxidized under the condition of a temperature of 900° C. to 1000° C. to form a thermal oxide film ($SiO_2$) 12 with a film thickness of 20 nm to 30 nm. Subsequently, a resist not shown in FIG. 1A is applied and then patterned to open a memory cell formation region, and thereafter boron (B) ions are implanted into the memory cell formation region under the conditions of an energy of 150 keV to 180 keV, an angle inclined from the vertical direction of about 70, and a concentration of $5 \times 10^{12}/cm^2$ to $7 \times 10^{12}/cm^2$ to form the p-type diffusion layer 2 in the Si substrate 1. Subsequently, after the resist is removed, annealing is performed in a nitrogen ($N_2$) atmosphere under the conditions of a temperature of about 1000° C. and a period of 10 min. to 20 min. in order to diffuse the implanted ions and recover crystals from a damage due to the ion implantation.

Figure 11B:
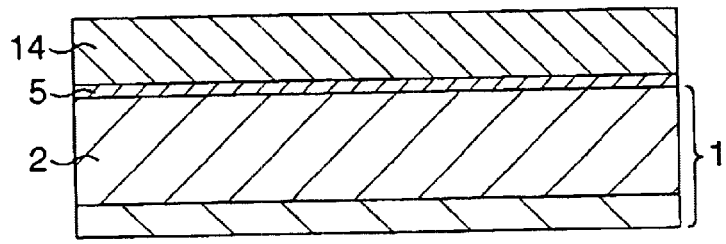

Subsequently, as shown in FIG. 11B, after the thermal oxide film 12 is entirely removed with hydrofluoric acid or the like, the silicon oxide film 5 with a film thickness of 20 nm to 30 nm is formed finder the condition of a temperature of 850° C. to 950° C. Thereafter, a silicon nitride film ($Si_3N_4$) 14 with a film thickness of 100 nm to 150 nm is formed by a CVD method.

Subsequently, as shown in FIG. 1C, a resist 15 is applied and patterned, and then only the silicon nitride film 14 is etched by dry anisotropic etching. In this event, all of a peripheral region is covered with the resist 15 to prevent the silicon nitride film 14 from being etched in the following processes.

Figure 11C:
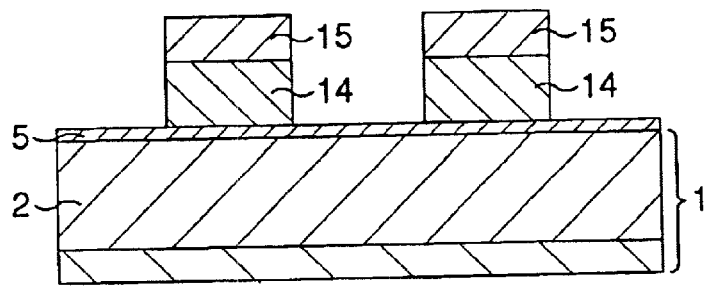
Figure 11D:
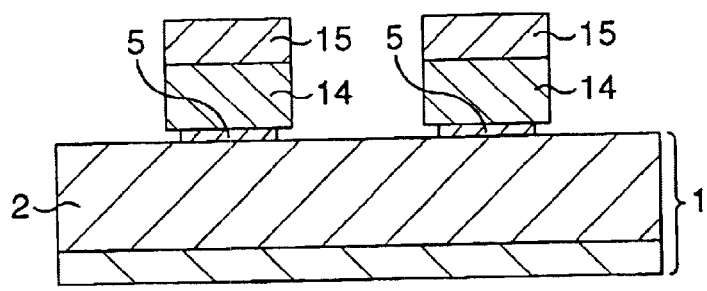
Figure 11E:
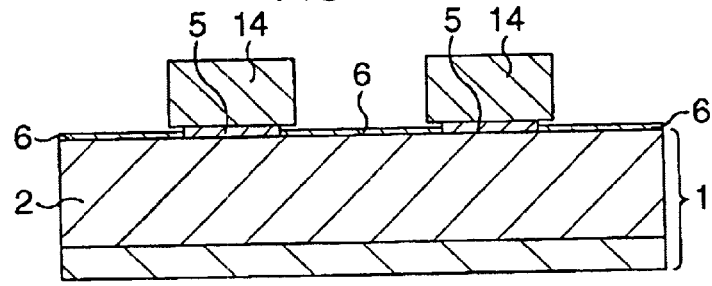

Subsequently, as shown in FIG. 11D, the silicon oxide film 5 being a base where the silicon nitride film 14 has been removed is successively removed with hydrofluoric acid or the like without peeling off the resist 15. Since the etching in this event is performed by wet etching with hydrofluoric acid or the like, the silicon oxide films 5 under the silicon nitride films 14 covered with the resists 15 are provided with side edges. Thereafter, the resists 15 are subjected to peeling processing.

Subsequently, as shown in FIG. 1E, the silicon oxide films 6 with a thickness of 7 nm to 10 nm, which will be tunnel oxide films of the memory cells, are formed by wet oxidation under the condition of a temperature of 800° C. to 900° C. or by dry oxidation under the condition of a temperature of 1000° C. to 1100° C.

Figure 12A:
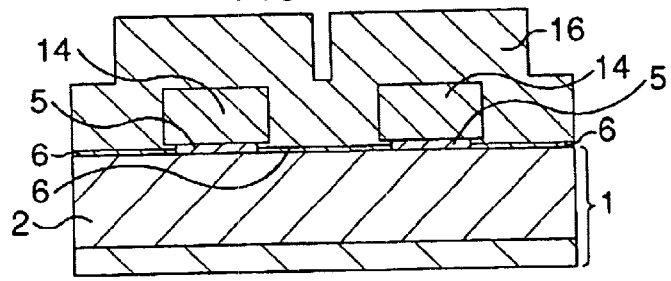
FIGS. 12A to 12E are schematic cross-sectional views showing, in order of processes, the manufacturing method of the semiconductor memory device according to the first embodiment, subsequently to FIGS. 11A to 11E.

Subsequently, as shown in FIG. 12A, an amorphous silicon 16 with a film thickness of 100 nm to 200 nm doped with phosphorus (P)>whose concentration is $2 \times 10^{20}/cm^3$ to $3 \times 10^{21}/cm^3$ is formed by the CVD method.

Figure 12B:
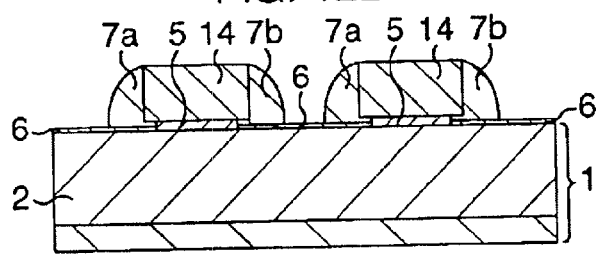

Subsequently, as shown in FIG. 12B, the entire surface of the amorphous silicon 16 is anisotropically etched (etched back) so that the amorphous silicon 16 is left only at both sides of each of the silicon nitride films 14 as side walls thereof, thereby forming the floating gates 7a and 7b. In this event, since the silicon nitride film 14 still remains at the entire peripheral region, there is no region where the amorphous silicon 16 remains as a side wall.

Figure 12C:
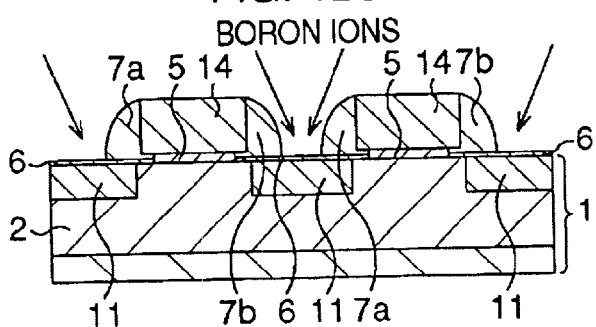

Subsequently, as shown in FIG. 12C, boron (B) ions are implanted in two directions under the conditions of an energy of 25 keV to 35 keV, an inclined angle of 25° to 30°, and a total concentration of $1 \times 10^{13}/cm^2$ to $3 \times 10^{13}/cm^2$ to form the p-type diffusion layers 11 as measures against a punch through. In this event, the silicon nitride film 14 remains on the entire surface of the peripheral region, so that the boron (B) ions never reach the Si substrate 1. This process is unnecessary here in the semiconductor memory device in FIG. 3.

Figure 12D:
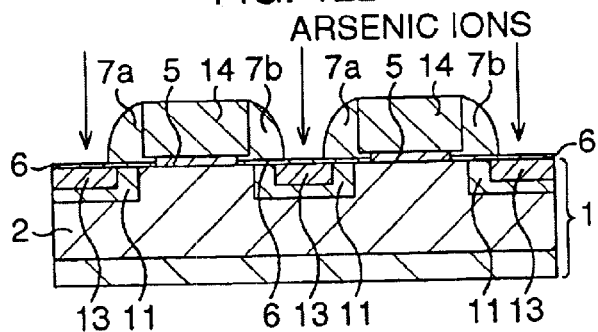

Subsequently, as shown in FIG. 12D, arsenic (As) ions are implanted to the entire surface under the conditions of an energy of 50 kev to 70 keV, an inclined angle of about 0°, and a concentration of $1 \times 10^{15}/cm^2$ to $3 \times 10^{15}/cm^2$ to form n-type diffusion layers 13 which will be the sources 3 and the drains 4 of the memory cells. In this event, the silicon nitride film 14 remains on the entire surface of the peripheral region, so that the arsenic (As) ions never reach the Si substrate 1.

Figure 12E:
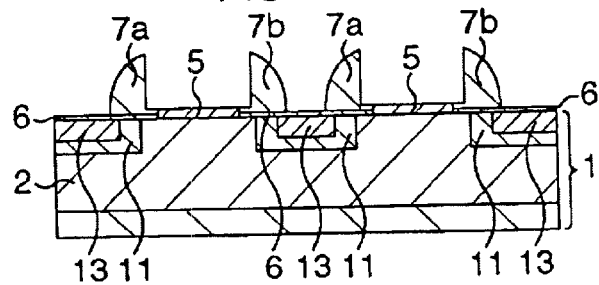

Subsequently, as shown in FIG. 12E, dry etching is performed to remove the entire silicon nitride films 14. In this event, the silicon nitride film 14 at the peripheral region is also removed.

Figure 13A:
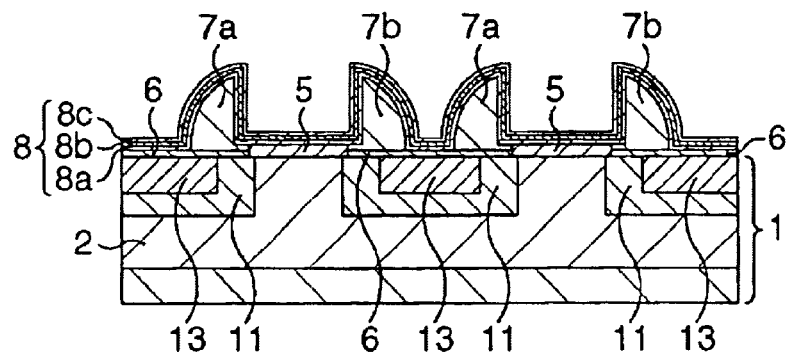
FIGS. 13A to 13C are schematic cross-sectional views showing, in order of processes, the manufacturing method of the semiconductor memory device according to the first embodiment, subsequently to FIGS. 12A to 12E.

Subsequently, as shown in FIG. 13A, an oxide film 8a with a film thickness of 5 nm to 7 nm is formed by the CVD method under the condition of a temperature of 700° C. to 800° C., then a nitride film 8b with a film thickness of 8 nm to 10 nm is formed on the oxide film 8a by the CVD method under the condition of a temperature of 700° C. to 800° C., and further an oxide film 8c with a film thickness of 4 nm to 7 nm is formed on the nitride film 8b by wet oxidation under the condition of a temperature of 900° C. to 1000° C. These three layers will become, as the ONO layer 8, portions of the insulating film between the floating gates and the control gate and the insulating film between the control gate and the Si substrate 1. Due to the thermal process of fabricating the ONO film 8 here, the p-type diffusion layers 11 and the n-type diffusion layers 13, which will be the sources 3 and the drains 4, are diffused to spread out.

Figure 13B:
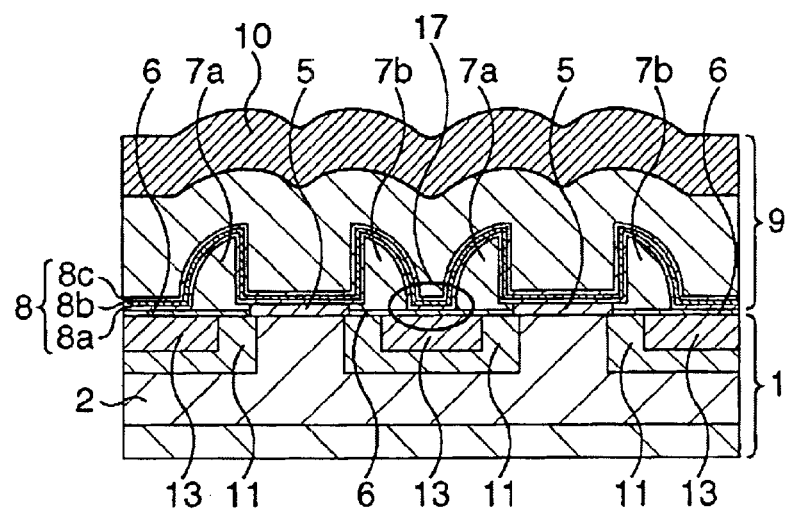

Subsequently, as shown in FIG. 13B, amorphous silicon with a film thickness of 100 nm to 200 nm doped with phosphorus (P) whose concentration is $2 \times 10^{20}/cm^3$ to $3 \times 10^{21}/cm^3$ is formed by the CVD method, and further the tungsten silicide 10 with a film thickness of 100 nm to 180 nm is formed on the surface layer thereof by the CVD method to form the control gate 9.

Thereafter, a resist is applied and patterned, and the tungsten silicide 10 and the amorphous silicon which become the control gate 9, the ONO film 8, and the amorphous silicon which will be the floating gates 7a and 7b are etched individually, thereby enabling the formation of the control gate 9 and the isolation of the floating gates 7a and 7b of the memory cells. At the time of etching the ONO film 8 for forming the control gate, the etching amount thereof at a junction portion between the ONO film 8 and the silicon oxide film 6 shown by numeral 17 here needs to be controlled. In addition, at the time of etching the amorphous silicon for forming the floating gates 7a and 7b, the etching selection ratio thereof needs to be controlled.

Although not illustrated in FIG. 13B, at the peripheral region of the memory cells, a resist is applied and patterned to provide openings before the formation of the amorphous silicon and the tungsten silicide 10 for forming the control gate 9, and after the ONO film 8 is removed by etching, the resist is peeled off, and an oxide film is formed. Thereafter, the amorphous silicon and the tungsten silicide 10 for forming the control gate 9 are formed, and a resist is newly applied, patterned, and etched after the formation of the word lines of the memory cells, thereby forming gate electrodes.

Figure 13C:
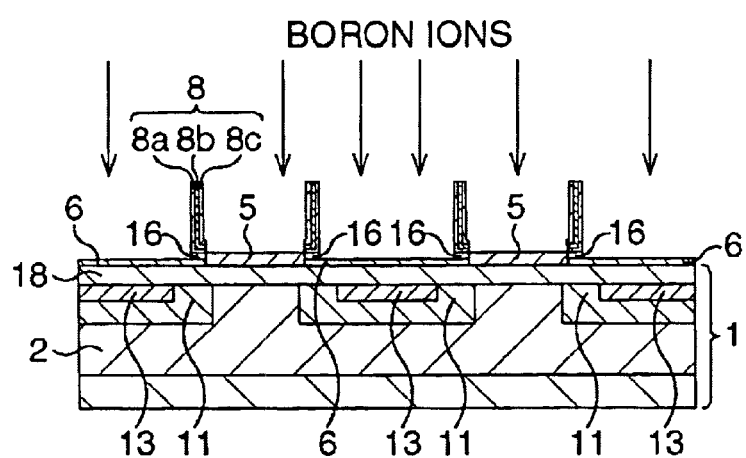

Further, as shown in FIG. 13C, for element isolation between adjacent bit lines and between adjacent gate lines, a resist is applied, patterned, and developed to provide openings in the resist only for the memory cells, and subsequently boron (B) ions are implanted under the conditions of an energy of 20 keV to 40 keV, an inclined angle of about 0°, and a concentration of $5 \times 10^{12}/cm^2$ to $1 \times 10^{13}/cm^2$, thereby forming an element isolation diffusion layer 18 being a p-type diffusion layer.

In FIG. 13C, only regions between the adjacent bit lines and between the adjacent gate lines are shown here, but, at word line formation regions, the tungsten silicide thereof is block films against the implantation of boron (B) ions to prevent the boron (B) ions from being implanted onto the channels.

Further, there is a possibility that parts of the amorphous silicon 16 remain under the ONO films 8 which remain like a fence as shown in FIG. 13C after the etching for forming the word lines. However, the parts present no problem because all of them become oxide films in the subsequent process of forming thermal oxide films with a film thickness of 5 nm to 10 nm, at a temperature of 800° C. to 900° C., which are formed as side wall block films for the floating gates 7a and 7b.

Modified Example 1 of Manufacturing Method of Semiconductor Memory Device According to First Embodiment Hereinafter, a modified example 1 of the manufacturing method of the semiconductor memory device according to the first embodiment is explained.

FIG. 14 is a schematic cross-sectional view showing the order of processes of the modified example 1 of the manufacturing method of the semiconductor memory device according to the first embodiment.

In this example, first, the flow goes through each process in FIGS. 11A to 11E and FIGS. 12A to 12D.

Figure 14A:
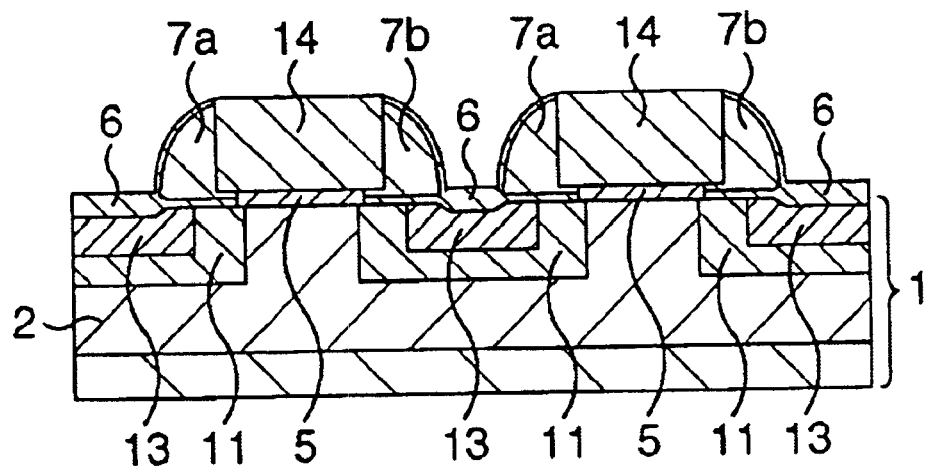
FIGS. 14A and 14B are schematic cross-sectional view showing the order of processes of a modified example 1 of the manufacturing method of the semiconductor memory device according to the first embodiment.

Subsequently, as shown in FIG. 14A, the silicon oxide films 6 between the n-type diffusion layers 13 and the floating gates 7a and 7b are caused to grow by wet oxidation under the condition of a temperature of 700° C. to 900° C. In this event, the oxide films are formed also on the floating gates 7a and 7b composed of the amorphous silicon, but since the n-type diffusion layers 13 are higher in impurity concentration than the floating gates 7a and 1b, the oxide films are formed thicker on the n-type diffusion layers 13 due to accelerated oxidation. The p-type diffusion layers 11, which cover the sources 3 and the drains 4, as measures against a punch through are unnecessary here in the semiconductor memory device shown in FIG. 3.

Further, forming of the silicon oxide films 6 between the floating gates 7a and 7b thick provides room for control of the etching amount of the ONO film 8 in correspondence with the increase in thickness at the time of etching the ONO film 8 in forming the control gate 9. Further, room is also provided for control of the etching selection ratio of the amorphous silicon at the time of etching the amorphous silicon constituting the floating gates 7a and 7b.

Figure 14B:
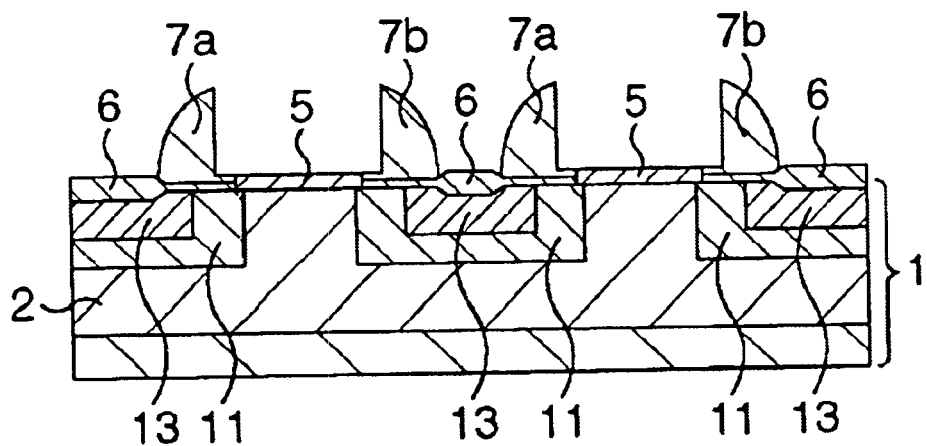

Subsequently, as shown in FIG. 14B, dry etching is performed to entirely remove the silicon nitride films 14. In this event, the silicon nitride film 14 at the peripheral region is also entirely removed. Thereafter, the oxide films formed on the floating gates 7a and 7b are removed by a hydrofluoric (HF) treatment. In this event, the silicon oxide films 6 between the floating gates 7a and 7b are also removed, but they have grown thick so that the Si substrate 1 is never exposed. The p-type diffusion layers 11, which cover the sources 3 and the drains 4, as measures against a punch through are unnecessary here in the semiconductor memory device shown in FIG. 3.

Then, the flow goes through the processes in FIG. 12E and FIGS. 13A to 13C, resulting in a completed semiconductor memory device of the first embodiment.

Modified Example 2 of Manufacturing Method of Semiconductor Memory Device According to First Embodiment Hereinafter, a modified example 2 of the manufacturing method of the semiconductor memory device according to the first embodiment is explained.

Figure 15:
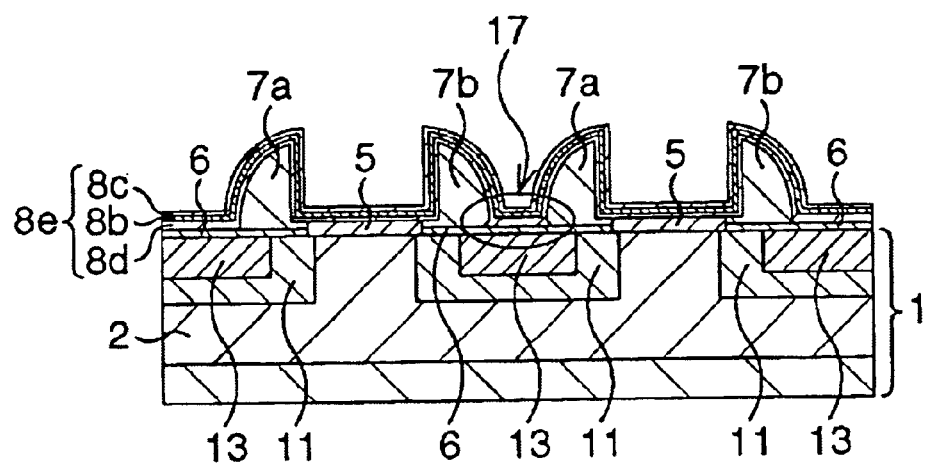
FIG. 15 is a schematic cross-sectional view showing a modified example 2 of the manufacturing method of the semiconductor memory device according to the first embodiment.

FIG. 15 is a schematic cross-sectional view showing the modified example 2 of the manufacturing method of the semiconductor memory device according to the first embodiment.

In this example, first, the flow goes through each process in FIGS. 11A to 11E and FIGS. 12A to 12E.

Subsequently, as shown in FIG. 15, an oxide film 8d with a film thickness of 5 nm to 7 nm is formed by wet oxidation under the condition of a temperature of 700° C. to 900° C., then a nitride film 8b with a film thickness of 8 nm to 10 nm is formed on the oxide film 8d by the CVD method under the condition of a temperature of 700° C. to 800° C., and further an oxide film 8c with a film thickness of 4 nm to 7 nm is formed on the nitride film 8b by wet oxidation under the condition of a temperature of 900° C. to 1000° C. These three layers will become, as an ONO layer 8e, portions of the insulating film between the floating gates and the control gate and the insulating film between the control gate and the Si substrate 1. Due to the thermal process of fabricating the ONO film 8e, the p-type diffusion layers 11 and the n-type diffusion layers 13 are diffused here to spread out.

The formation of the oxide film 8d is performed in the diffusing process, in which the oxide film 8d is formed thick on the n-type diffusion layers 13 due to accelerated oxidation because the n-type diffusion layers 13 are high in impurity concentration. The p-type diffusion layers 11, which cover the sources 3 and the drains 4, as measures against a punch through are unnecessary here in the semiconductor memory device shown in FIG. 3.

Then, the flow goes through the processes in FIGS. 13B and 13C, resulting in a completed semiconductor memory device of the first embodiment.

Modified Example 3 of Manufacturing Method of Semiconductor Memory Device According to First Embodiment Hereinafter, a modified example 3 of the manufacturing method of the semiconductor memory device according to the first embodiment is explained.

Figure 16:
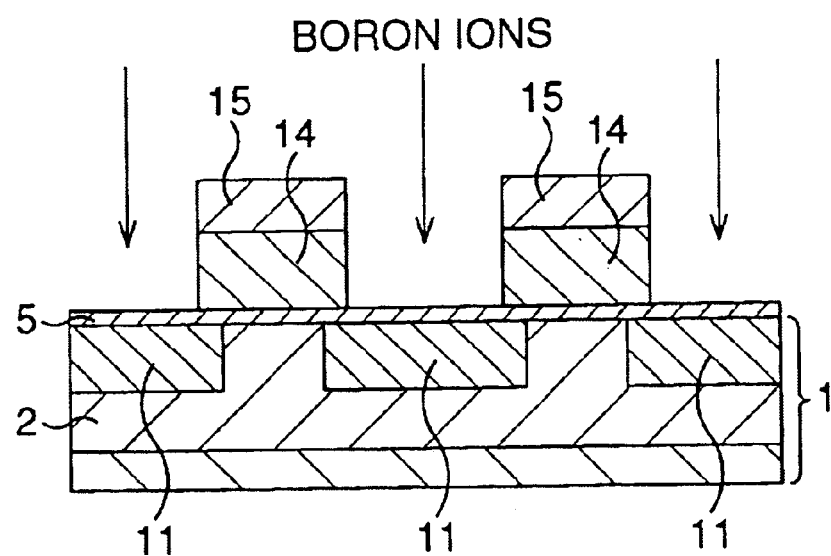
FIG. 16 is a schematic cross-sectional view showing a modified example 3 of the manufacturing method of the semiconductor memory device according to the first embodiment.

FIG. 16 is a schematic cross-sectional view showing the modified example 3 of the manufacturing method of the semiconductor memory device according to the first embodiment.

In this example, first, the flow goes through each process in FIGS. 11A to 11C.

Subsequently, as shown in FIG. 16, boron (B) ions are implanted under the conditions of an energy of 25 keV to 35 keV, an inclined angle of about 0°, and a concentration of $1 \times 10^{13}/cm^2$ to $5 \times 10^{13}/cm^2$ to form the p-type diffusion layers 11 as measures against a punch through. In this event, the silicon nitride film 14 remains on the entire surface of the peripheral region, so that the boron (B) ions never reach the Si: substrate 1. This process is unnecessary here in the semiconductor memory device in FIG. 3.

Then, The flow goes through the processes in FIGS. 11D and 11E, FIGS. 12A, 12B, 12D and 12E, and FIGS. 13A to 13C, resulting in a completed semiconductor memory device of the first embodiment.

Modified Example 4 of Manufacturing Method of Semiconductor Memory Device According to First Embodiment Hereinafter, a modified example 4 of the manufacturing method of the semiconductor memory device according to the first embodiment is explained.

FIGS. 17A to 17D are schematic cross-sectional views showing the order of processes of the modified example 4 of the manufacturing method of the semiconductor memory device according to the first embodiment. This manufacturing method is characterized in that a silicon oxide film ($SiO_2$) with a good covering property at step portions is formed by the CVD method using TEOS (tetraethyl orthosilicate).

In this example, first, the flow goes through each process in FIGS. 11A to 11E and FIGS. 12A to 12D.

Figure 17A:
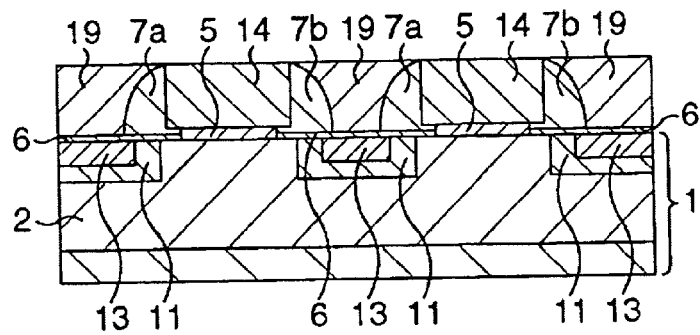
FIGS. 17A to 17D are schematic cross-sectional views showing the order of processes of a modified example 4 of the manufacturing method of the semiconductor memory device according to the first embodiment.

Subsequently, as shown in FIG. 17A, a silicon oxide film (TEOS $SiO_2$) 19 with a film thickness of 500 nm to 1000 nm is formed and then polished by a CMP method down to the top of the silicon nitride films 14. The p-type diffusion layers 11, which cover the sources 3 and the drains 4, as measures against a punch through are unnecessary here in the semiconductor memory device shown in FIG. 3.

Figure 17B:
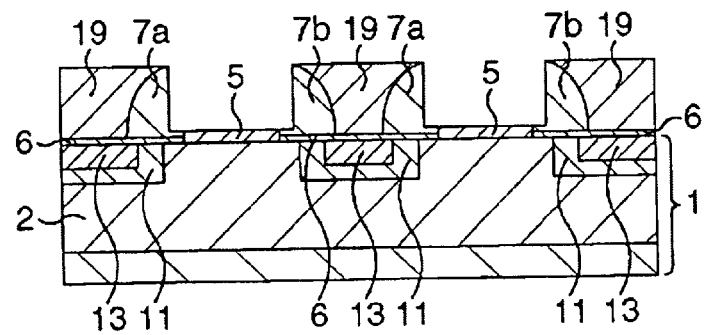

Subsequently, as shown in FIG. 17B, the silicon nitride films 14 are entirely removed by dry etching or phosphoric acid boiling. In this event, the silicon nitride film 14 at the peripheral region is also removed.

Figure 17C:
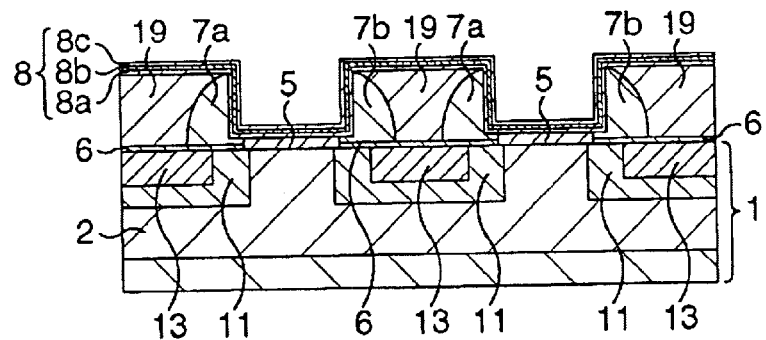

Subsequently, as shown in FIG. 17C, an oxide film 8a with a film thickness of 5 nm to 7 nm is formed by the CVD method under the condition of a temperature of 700° C. to 800° C., then a nitride film 8b with a film thickness of 8 nm to 10 nm is formed on the oxide film 8a by the CVD method under the condition of a temperature of 700° C. to 800° C., and further an oxide film 8c with a film thickness of 4 nm to 7 nm is formed on the nitride film 8b by wet oxidation under the condition of a temperature of 900° C. to 1000° C. These three layers will become, as the ONO layer 8, portions of the insulating film between the floating gates and the control gate and the insulating film between the control gate and the Si substrate 1. Due to the thermal process of fabricating the ONO film 8, the p-type diffusion layers 11 and the n-type diffusion layers 13 are diffused here to spread out.

Figure 17D:
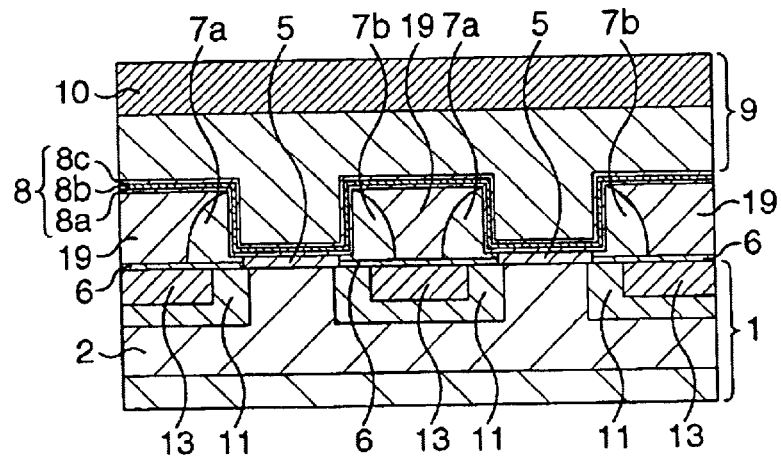

Subsequently, as shown in FIG. 17D, amorphous silicon with a film thickness of 100 nm to 200 nm doped with phosphorus (P) whose concentration is $2 \times 10^{20}/cm^3$ to $3 \times 10^{21}/cm^3$ is formed by the CVD method, and further the tungsten silicide 10 with a film thickness of 100 nm to 180 nm is formed on the surface layer thereof by the CVD method to form the control gate 9.

Thereafter, a resist is applied and patterned, and the amorphous silicon and the tungsten silicide 10 which become the control gate 9, the ONO film 8, and the amorphous silicon which will be the floating gates 7a and 7b are etched individually, thereby enabling the formation of the control gate 9 and the isolation of the floating gates 7a and 7b of the memory cell.

Although not illustrated in FIG. 17D, at the peripheral region of the memory cells, a resist is applied and patterned to provide openings before the formation of the amorphous silicon and the tungsten silicide 10 for forming the control gate 9, and after the ONO film 8 is removed by etching, the resist is peeled off, and an oxide film is formed. Thereafter, the amorphous silicon and the tungsten silicide 10 for forming the control gate 9 are formed, and a resist is newly applied, patterned, and etched after the formation of the word lines of the memory cells, thereby forming gate electrodes. The element isolation between the memory cells and the word lines is similar to that in FIG. 13C.

Modified Example 5 of Manufacturing Method of Semiconductor Memory Device According to First Embodiment Hereinafter, a modified example 5 of the manufacturing method of the semiconductor memory device according to the first embodiment is explained.

Figure 18:
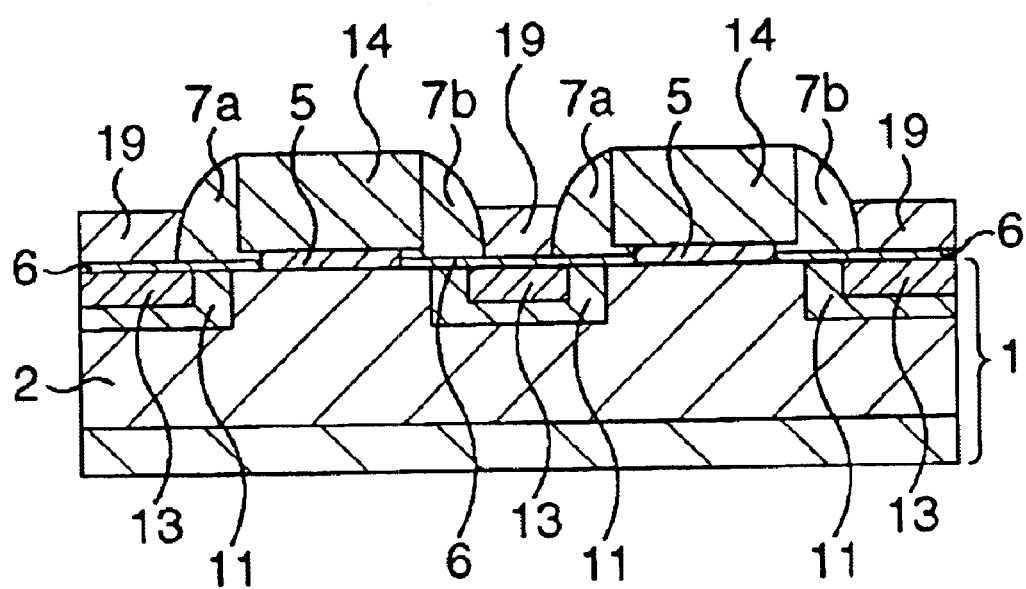
FIG. 18 is a schematic cross-sectional view showing a modified example 5 of the manufacturing method of the semiconductor memory device according to the first embodiment.

FIG. 18 is a schematic cross-sectional view showing the modified example 5 of the manufacturing method of the semiconductor memory device according to the first embodiment.

In this example, first, the flow goes through each process in FIGS. 11A to 11E, FIGS. 12A to 12D, and FIG. 17A.

Subsequently, as shown in FIG. 18, the silicon oxide film 19 is etched back by anisotropic etching. The p-type diffusion layers 11, which cover the sources 3 and the drains 4, as measures against a punch through are unnecessary here in the semiconductor memory device shown in FIG. 3.

Then, the flow goes through the processes in FIGS. 17B to 17D, resulting in a completed semiconductor memory device of the first embodiment.

As has been described, in the semiconductor memory device of this embodiment, the floating gate 7 is provided in the form of two separated parts in one memory cell 20, thereby allowing the floating gates to be individually programmable. As a result, the integration can be doubled in the same memory cell as compared to the case in which a single floating gate is provided.

Further, since the bit lines (BL1 to BL4) are formed of the diffusion layers, the contact can be minimized, and the area of each memory cell 20 can also be reduced.

Second Embodiment

A semiconductor memory device according to a second embodiment of the present invention is an AND-type non-volatile memory.

Figure 19:
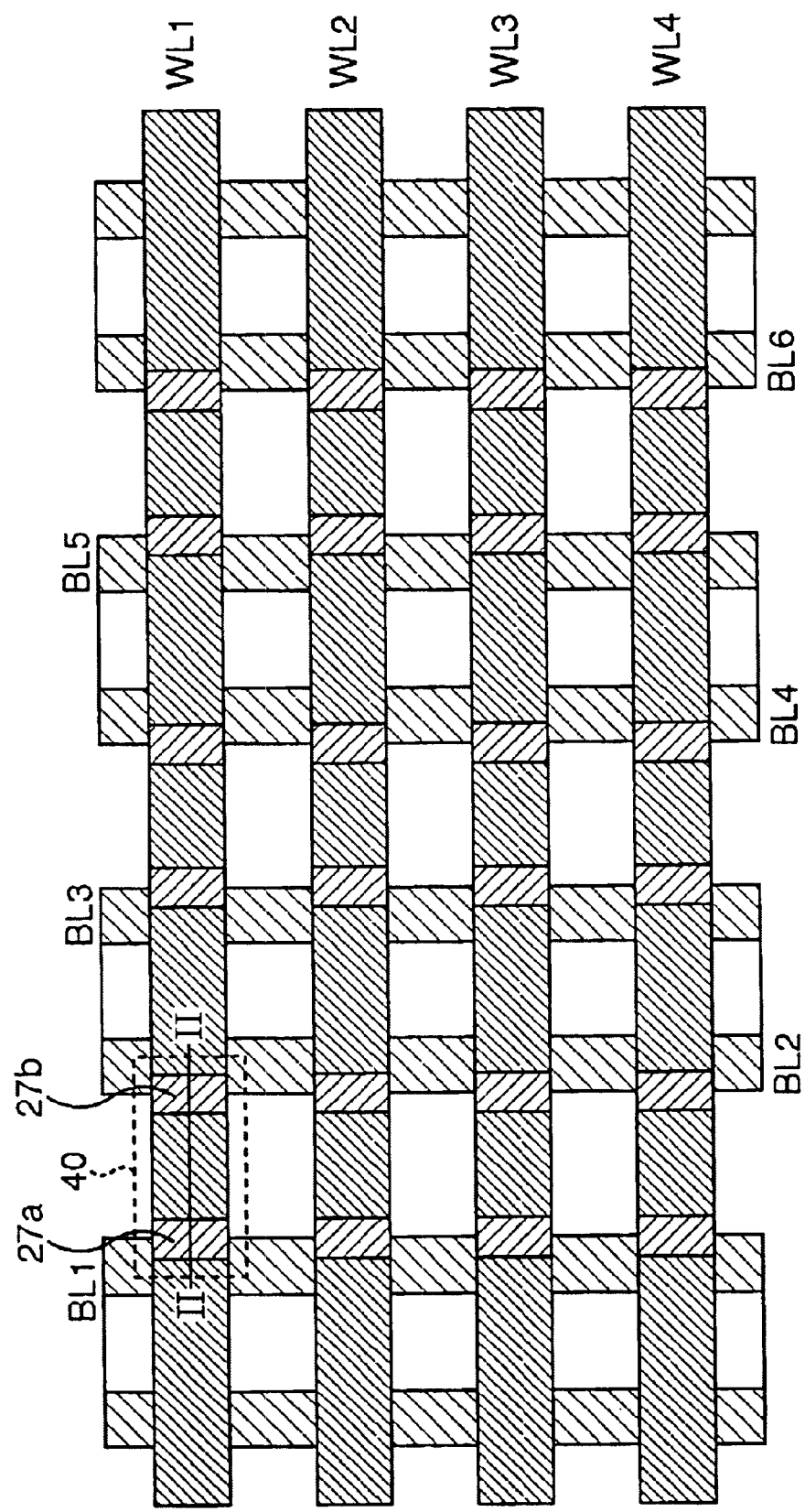
FIG. 19 is a plan view showing a semiconductor memory device of a second embodiment in the present invention.
Figure 20:
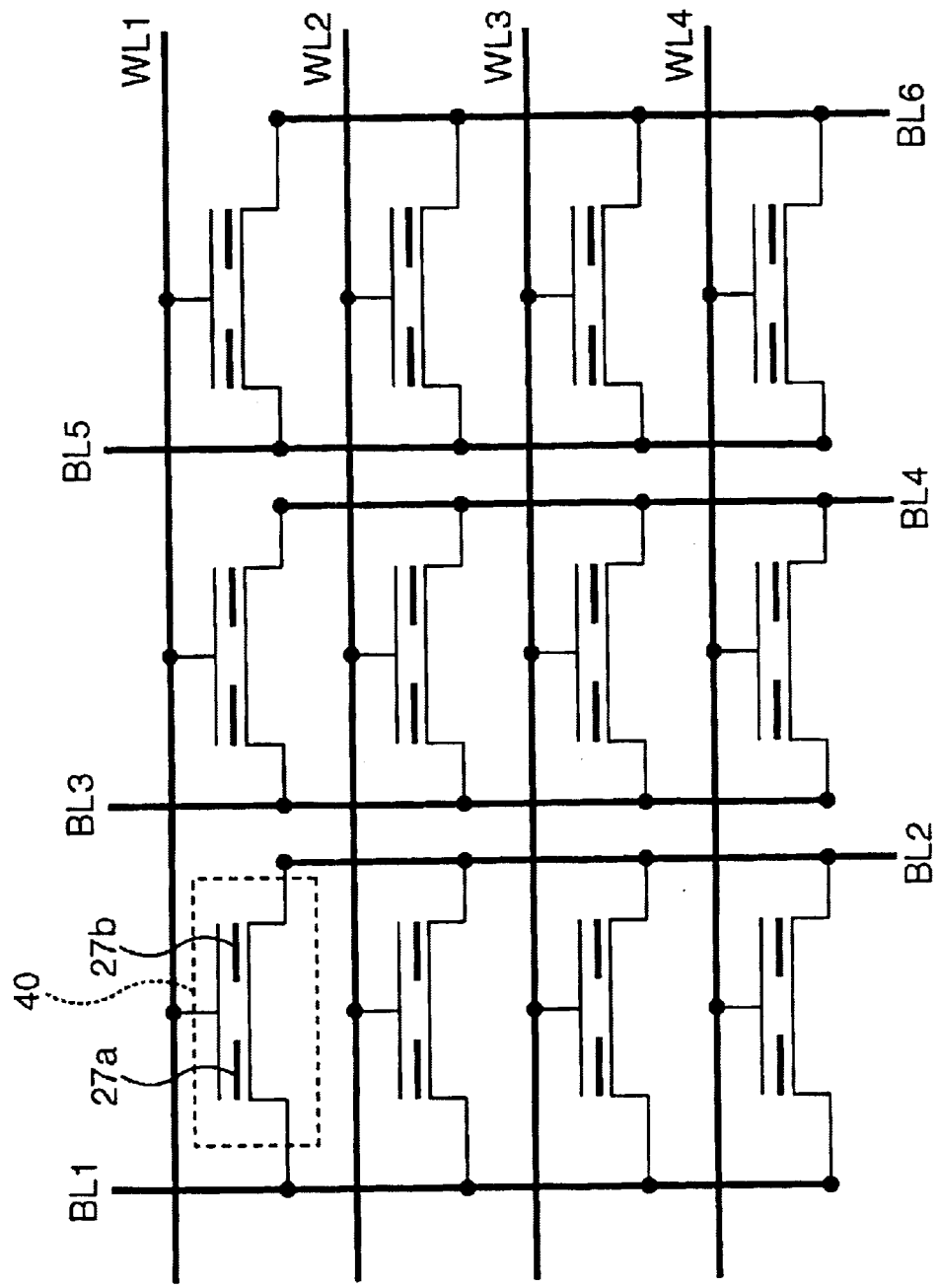
FIG. 20 is an equivalent circuit diagram showing the semiconductor memory device of the second embodiment in the present invention.

FIG. 19 is a plan view of the semiconductor memory device according to the second embodiment, and FIG. 20 is an equivalent circuit diagram thereof. As shown in FIG. 19 and FIG. 20, in the semiconductor memory device, word lines (WL1 to WL4) corresponding to control gates and bit lines (BL1 to BL4) are formed to cross each other at right angles, and memory cells 40 are formed in a matrix form such that a memory cell 40 on one word line (WL1 to WL4) overlaps two bit lines.

Further, at regions sandwiched between the memory cells 40 in the direction of the bit lines (BL1 to BL4), element isolation diffusion layers are formed. The bit lines (BL1 to BL4) are formed of diffusion layers here, and connection between the bit lines (BL1 to BL4) and their peripheral circuit is established by wiring using metal to decrease the resistance of the bit lines.

Figure 21:
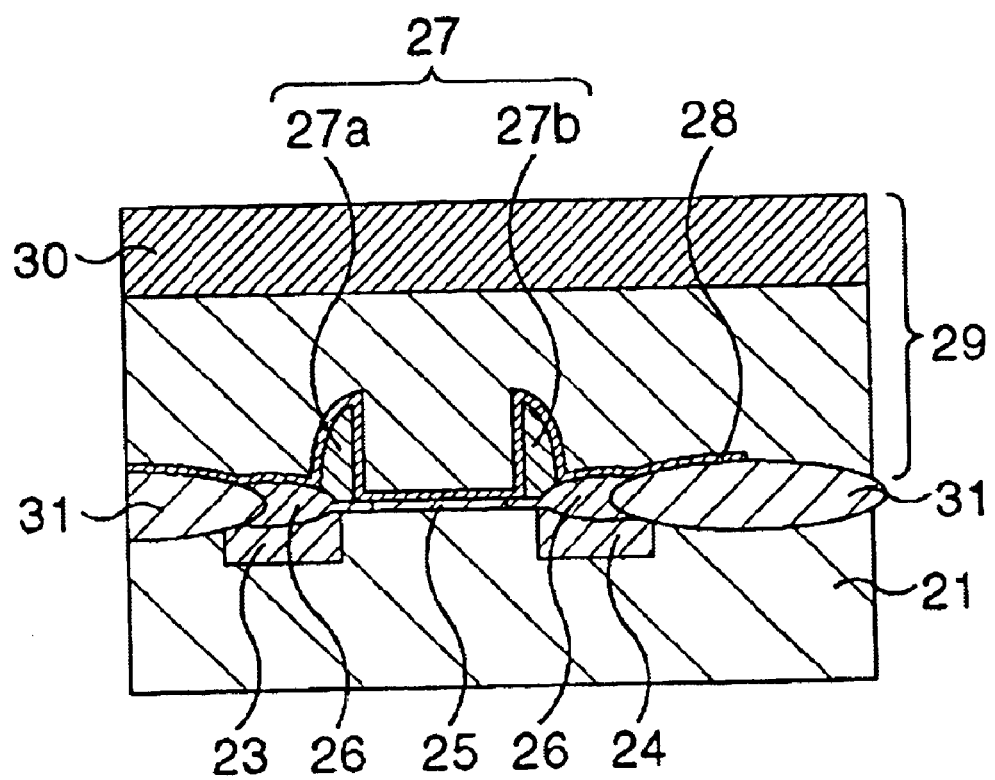
FIG. 21 is a schematic cross-sectional view showing the semiconductor memory device of the second embodiment in the present invention.

FIG. 21 shows a schematic cross-sectional view of the memory cell 40 between II and II shown in FIG. 19. As shown in FIG. 21, the memory cell 40 comprises: silicon oxide films ($SiO_2$) 25 and 26 as a gate insulating film formed on a Si substrate 21; a floating gate 27 formed on the silicon oxide films 26; an ONO film 28 formed to cover the floating gate 27 and the silicon oxide films 25 and 26; and a control gate 29 as the word line formed on the ONO film 28.

The memory cell 40 in this embodiment is characterized in that the floating gate 27 is formed above a channel, separated into a pair of floating gates 27a and 27b, similarly to the first embodiment. These separately formed floating gates 27a and 27b are disposed independently above a source 23 and a drain 24 respectively to be able to individually inject and draw electrons to and from the source 23 and the drain 24.

The pair of floating gates 27a and 27b are in the form of projecting above the center portion of a channel because they are side walls formed on inner walls of an insulating film which is formed on the silicon oxide film 25 and removed later.

The Si substrate 21 is formed with the source 23 and the drain 24, and each of them constitutes the bit line.

The silicon oxide film 25 is formed thicker than the silicon oxide films 26, thereby causing the floating gates 27a and 27b, which are formed as the side walls, to project more above the channel center portion to facilitate capture of electrons during programming. Further, constituting the silicon oxide film 25 of the silicon oxide films 26 is also included within the scope of this embodiment. The fabrication process of the silicon oxide film 25 can be simplified as described above.

Further, it is also possible that diffusion layers having the opposite conduction type to those of the source 23 and the drain 24 are provided therearound as measures against a punch through, similarly to the modified example of the semiconductor memory device in the first embodiment.

Manufacturing Method of Semiconductor Memory Device According to Second Embodiment Hereinafter, a manufacturing method of the semiconductor memory device according to the second embodiment is explained.

FIGS. 22A to 22E through FIG. 24 are schematic cross-sectional views showing, in order of processes, the manufacturing method of the semiconductor memory device shown in FIG. 21.

Figure 22A:
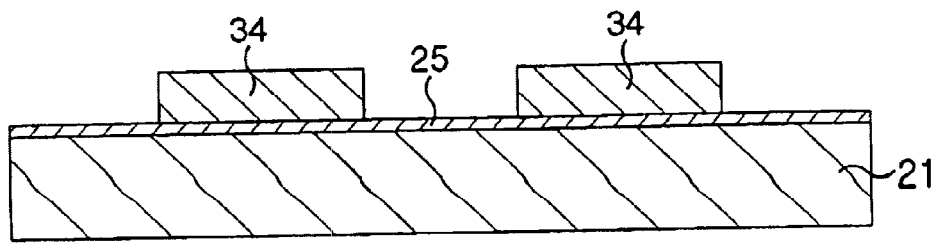
FIGS. 22A to 22E are schematic cross-sectional views showing, in order of processes, a manufacturing method of the semiconductor memory device according to the second embodiment.

First, as shown in FIG. 22A, the silicon oxide film 25 with a film thickness of 20 nm to 30 nm is formed under the condition of a temperature of 850° C. to 950° C. Thereafter, a silicon nitride film ($Si_3N_4$) 34 with a film thickness of 100 nm to 150 nm is formed by a CVD method and patterned for a memory cell formation region.

Figure 22B:
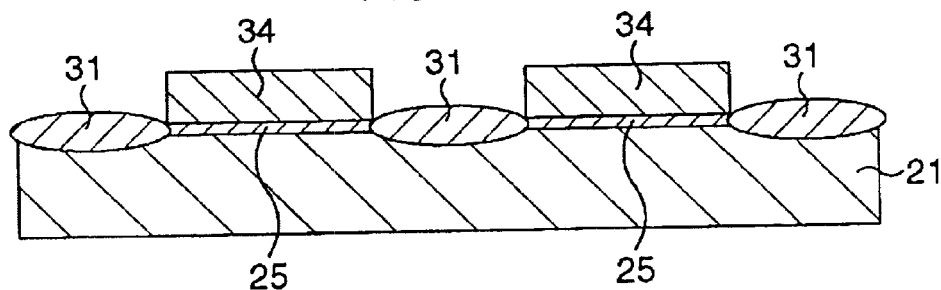

Subsequently, as shown in FIG. 22B, the surface of the Si substrate 21 is selectively oxidized with the silicon nitride films 34 as anti-oxidizing films, so that silicon oxide films ($SiO_2$) 31 are selectively formed in the surface of the Si substrate 21 to define the element isolation regions.

Figure 22C:
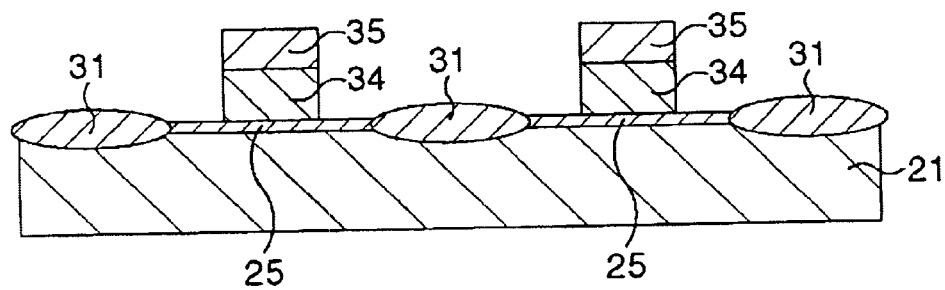

Subsequently, as shown in FIG. 22C, a resist 35 is applied and patterned, and then only the silicon nitride films 34 are etched by dry anisotropic etching.

Figure 22D:
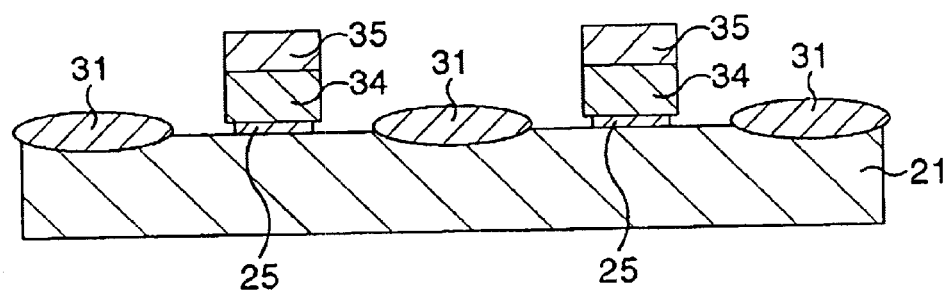

Subsequently, as shown in FIG. 22D, the silicon oxide film 25 being a base where the silicon nitride film 34 has been removed is successively removed with hydrofluoric acid or the like without peeling off the resist 35. Since the etching in this event is performed by wet etching with hydrofluoric acid or the like, the silicon oxide films 25 under the silicon nitride films 34 covered with the resists 35 are provided with side edges. Thereafter, the resists 35 are subjected to peeling processing.

Figure 22E:
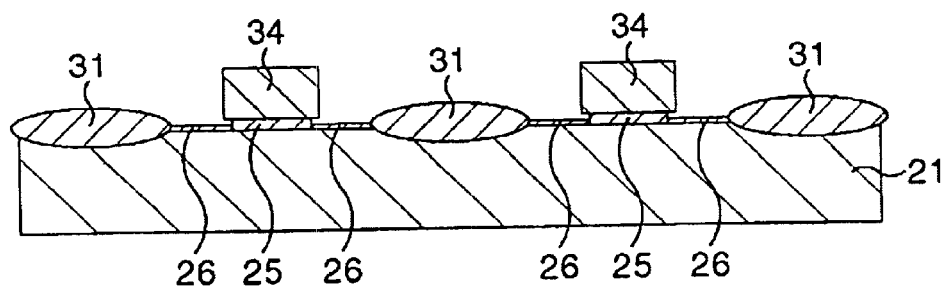

Subsequently, as shown in FIG. 22E, the silicon oxide films 26 with a thickness of 7 nm to 10 nm, which will be tunnel oxide films of the memory cells, are formed by wet oxidation under the condition of a temperature of 800° C. to 900° C. or by dry oxidation under the condition of a temperature of 1000° C. to 1100° C.

Figure 23A:
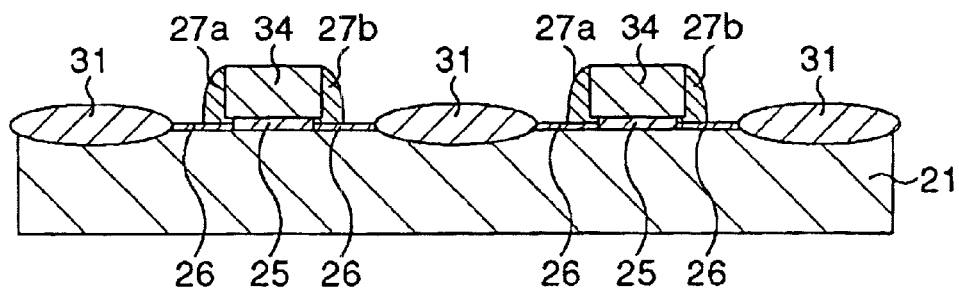
FIGS. 23A to 23E are schematic cross-sectional views showing, in order of processes, the manufacturing method of the semiconductor memory device according to the second embodiment, subsequently to FIGS. 22A to 22E.

Subsequently, as shown in FIG. 23A, amorphous silicon with a film thickness of 100 nm to 200 nm doped with phosphorus (P) whose concentration is $2 \times 10^{20}/cm^3$ to $3 \times 10^{21}/cm^3$ is formed by the CVD method. The entire surface of the amorphous silicon is anisotropically etched (etched back) so that the amorphous silicon is left only at both sides of the silicon nitride films 34 as side walls thereof, thereby forming the floating gates 27a and 27b.

Figure 23B:
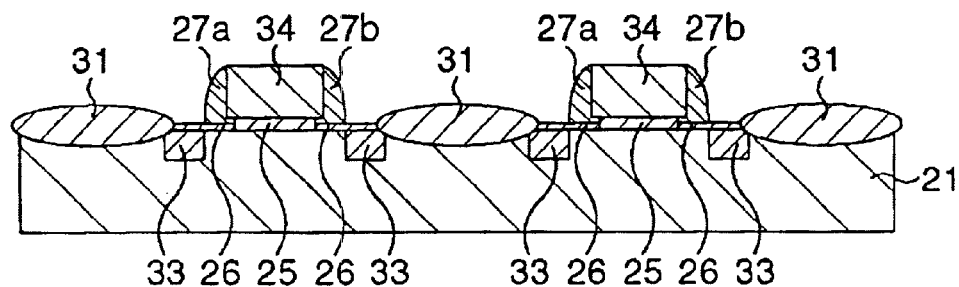

Subsequently, as shown in FIG. 23B, arsenic (As) ions are implanted to the entire surface under the conditions of an energy of 50 keV to 70 keV, an inclined angle of about 0°, and a concentration of $1 \times 10^{15}/cm^2$ to $3 \times 10^{15}/cm^2$ to form n-type diffusion layers 33 which will be the sources 23 and the drains 24 of the memory cells. In this event, the silicon nitride films 34 remain above the channel portions of the Si substrate 21, so that the arsenic (As) ions never reach the Si substrate 21.

Figure 23C:
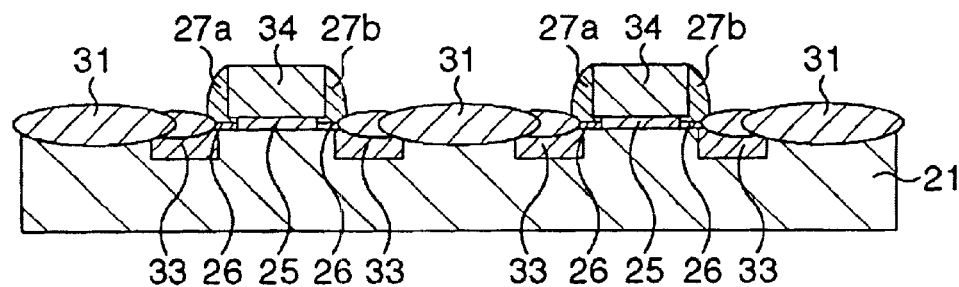

Subsequently, as shown in FIG. 23C, the surface of the Si substrate 21 is selectively oxidized with the silicon nitride films 34 as anti-oxidizing films, thereby causing the silicon oxide films 26 between the n-type diffusion layers 33 and the floating gates 27a and 27b to grow. Due to this thermal oxidation, the n-type diffusion layers 33 are diffused to spread out.

Figure 23D:
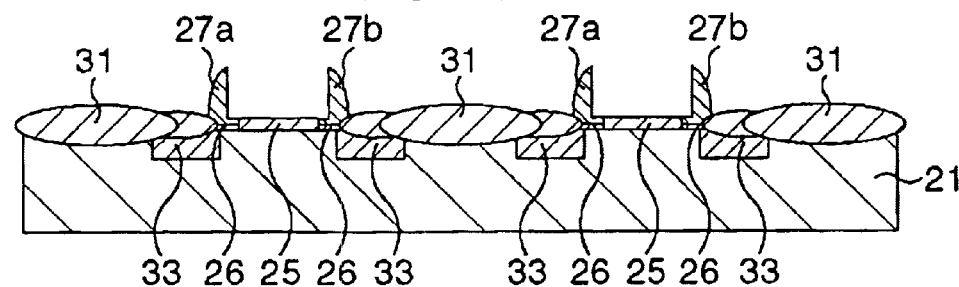

Subsequently, as shown in FIG. 23D, the silicon nitride films 34 are entirely removed by performing dry etching.

Figure 23E:
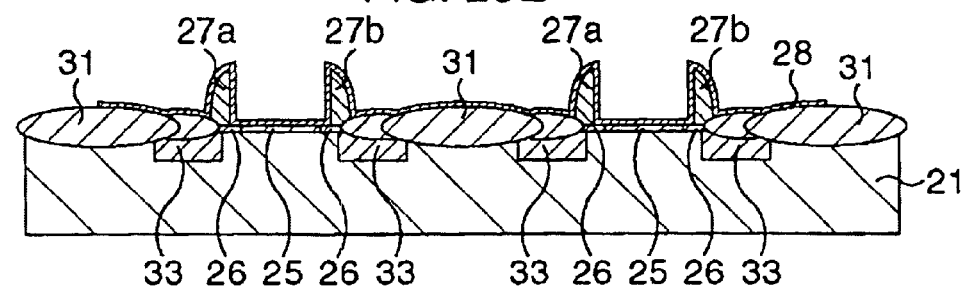

Subsequently, as shown in FIG. 23E, an oxide film 28a with a film thickness of 5 nm to 7 nm is formed by the CVD method under the condition of a temperature of 700° C. to 800° C., then a nitride film 28b with a film thickness of 8 nm to 10 nm is formed on the oxide film 28a by the CVD method under the condition of a temperature of 700° C. to 800° C., and further an oxide film 28c with a film thickness of 4 nm to 7 nm is formed on the nitride film 28b by wet oxidation under the condition of a temperature of 900° C. to 1000° C. These three layers will become, as the ONO layer 28, portions of the insulating film between the floating gates 27a and 27b and the control gate 29 and the insulating film between the control gate 29 and the Si substrate 21.

Figure 24:
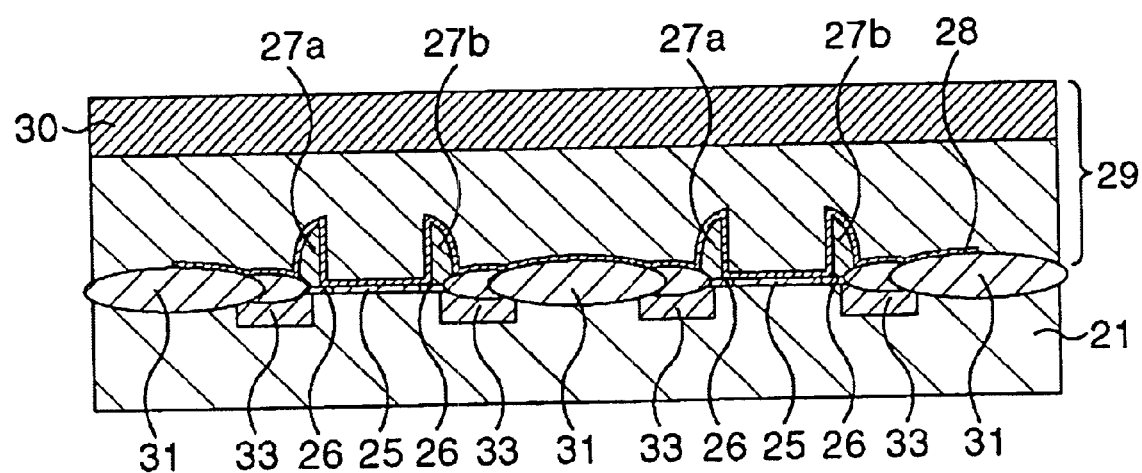
FIG. 24 is a schematic cross-sectional view showing, in order of processes, the manufacturing method of the semiconductor memory device according to the second embodiment, subsequently to FIGS. 23A to 23E.

Subsequently, as shown in FIG. 24, polycrystalline silicon (poly Si) with a film thickness of 100 nm to 200 nm is formed by the CVD method, and further a tungsten silicide 30 with a film thickness of 100 nm to 180 nm is formed on the surface layer thereof by the CVD method to form the control gate 29.

Thereafter, a resist is applied and patterned, and the tungsten silicide 30 and the polycrystalline silicon (poly Si) which become the control gate 29, the ONO film 28, and the amorphous silicon which will be the floating gates 27a and 27b are etched individually, thereby enabling the formation of the control gate 29 and the isolation of the floating gates 27a and 27b of the memory cell.

Comparative Example of Semiconductor Memory Device of Second Embodiment

Figure 25:
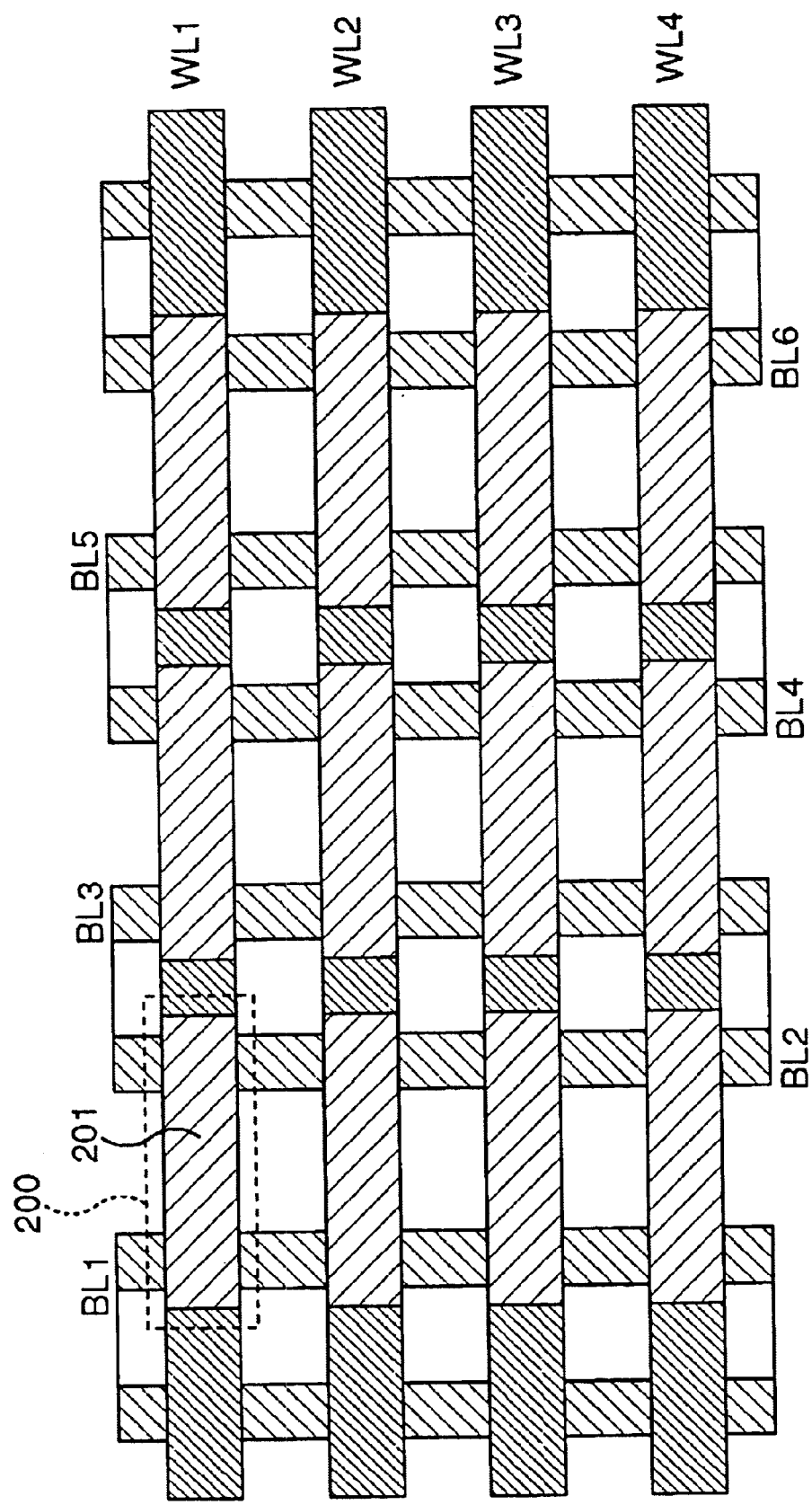
FIG. 25 shows a comparative example and is a plan view of an AND-type non-volatile memory.
Figure 26:
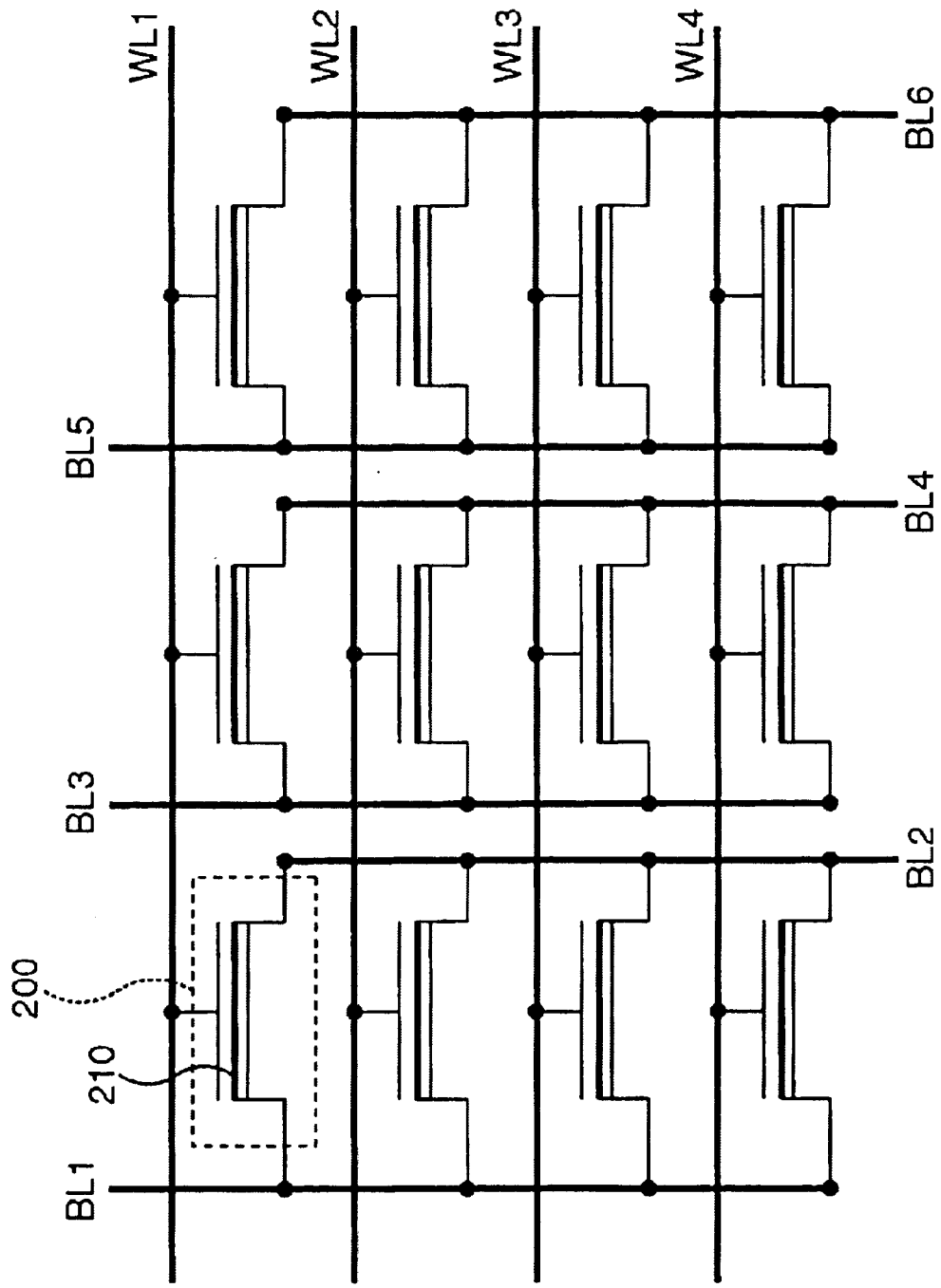
FIG. 26 shows the comparative example and is an equivalent circuit diagram of the AND-type nonvolatile memory.
Figure 27:
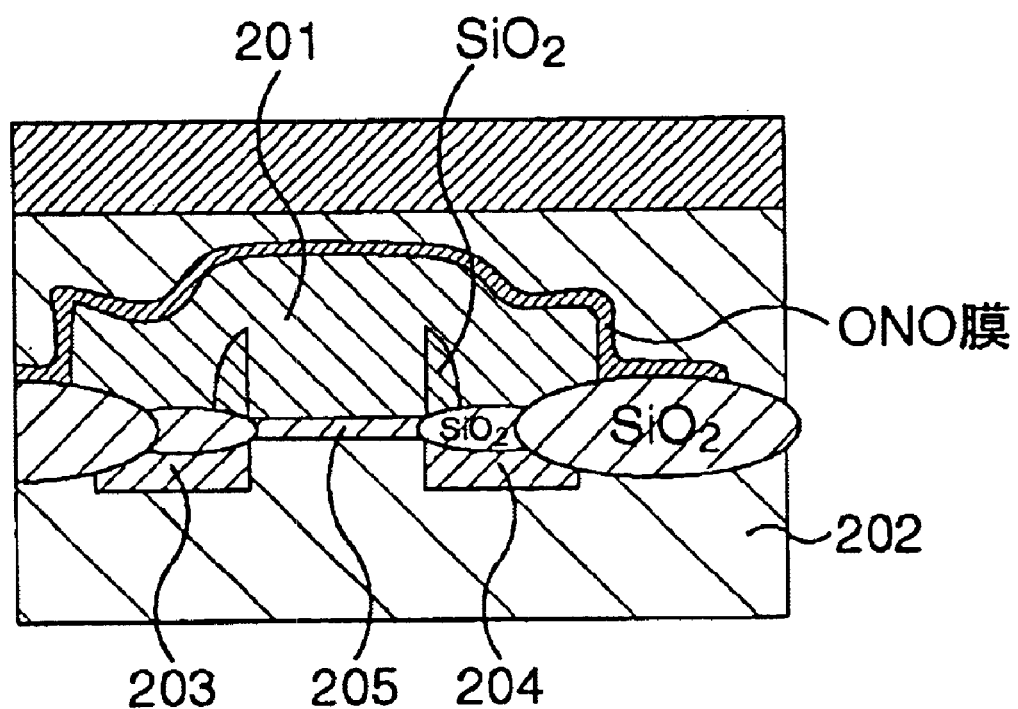
FIG. 27 shows the comparative example and is a schematic cross-sectional view of the AND-type nonvolatile memory.
Figure 28:
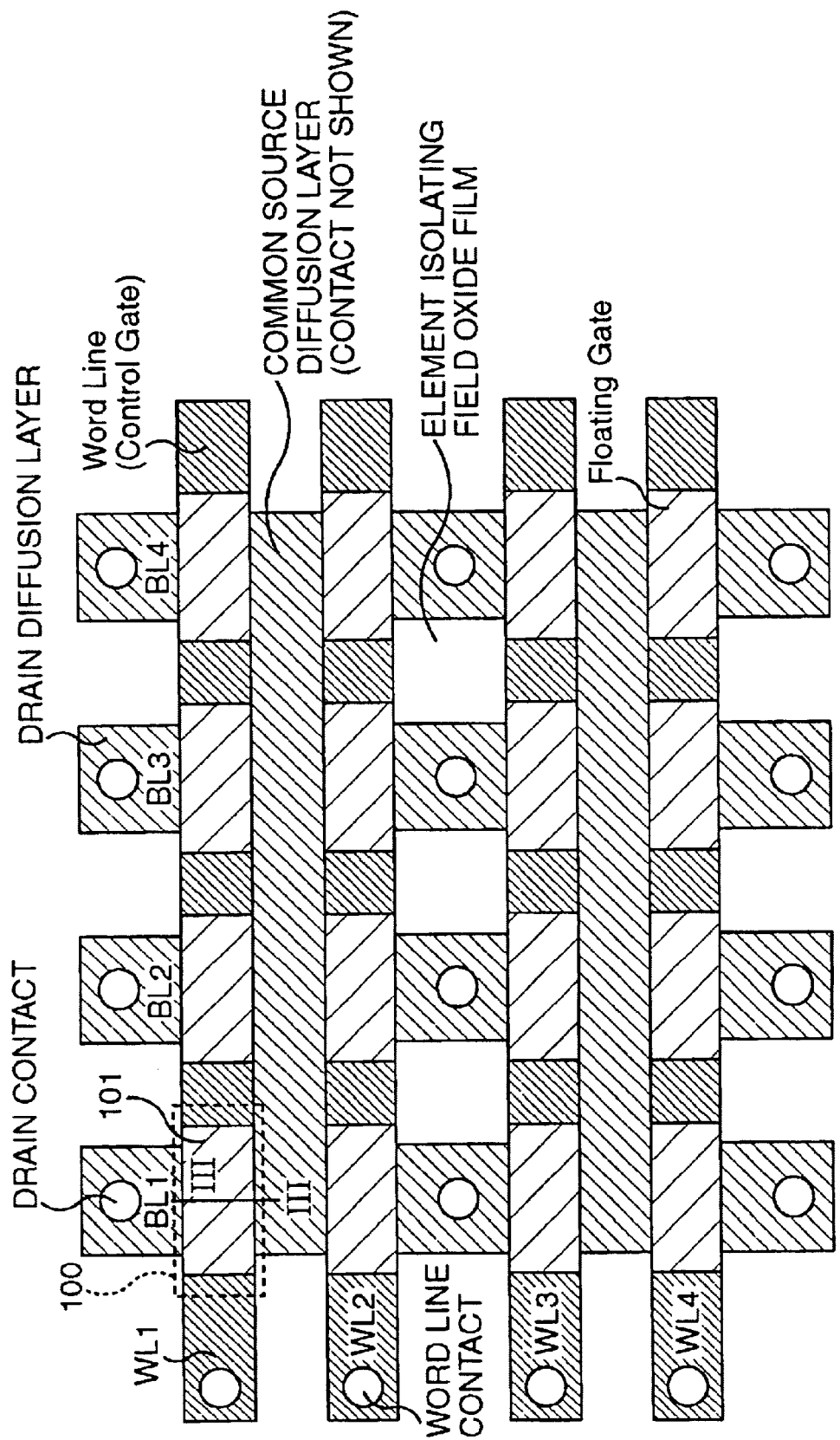
FIG. 28 shows a conventional example and is a plan view of a NOR-type non-volatile memory.
Figure 29:
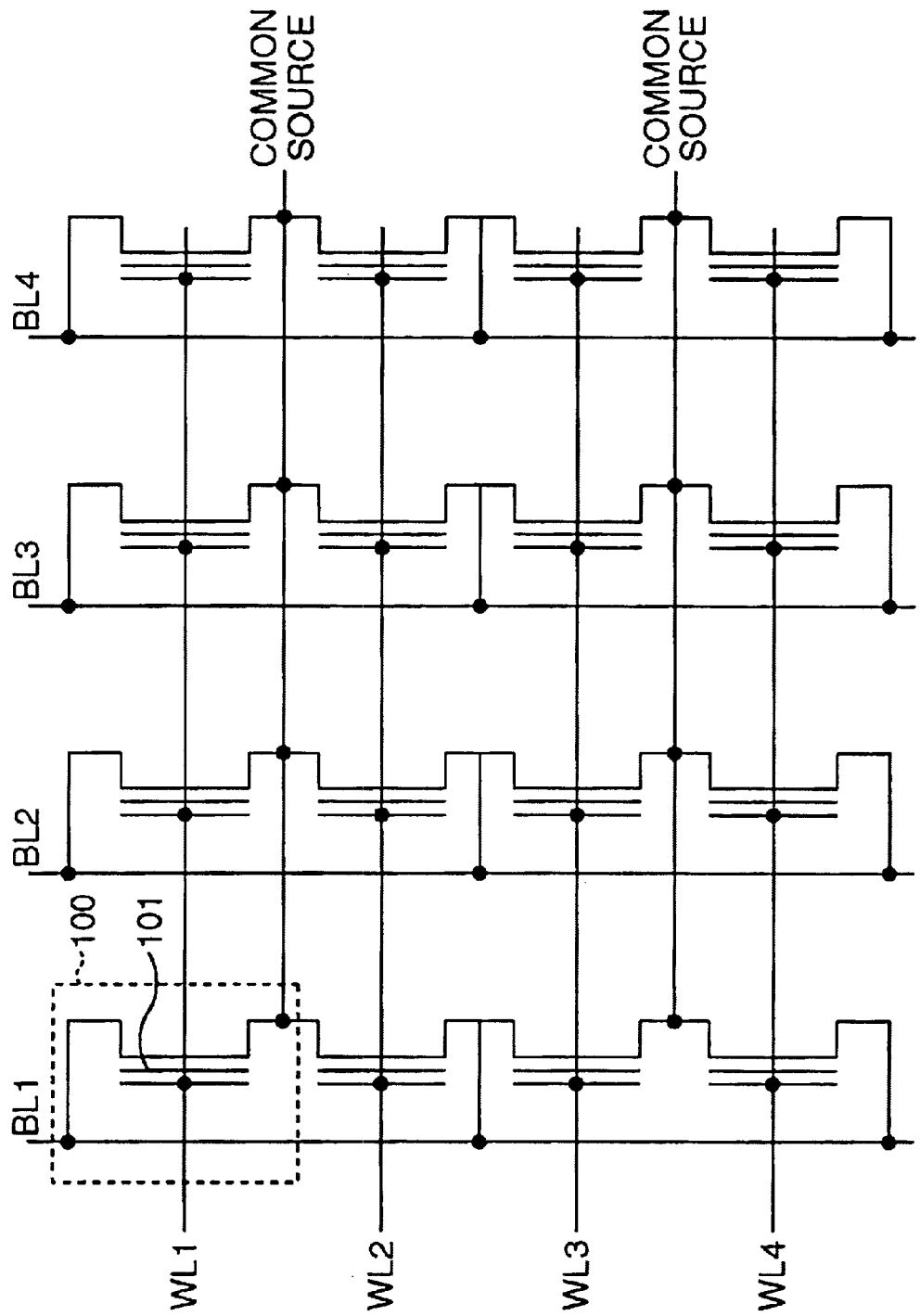
FIG. 29 shows the conventional example and is an equivalent circuit diagram of the NOR-type nonvolatile memory.
Figure 30:
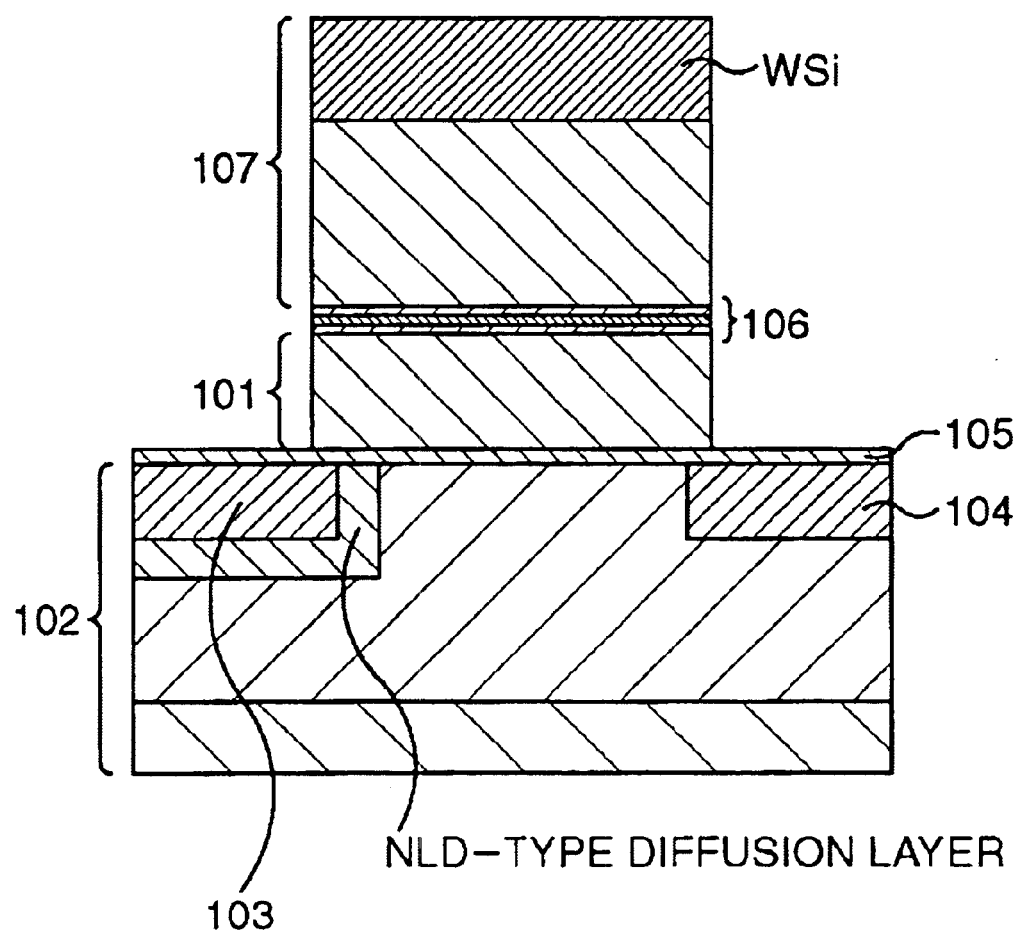
FIG. 30 shows the conventional example and is a schematic cross-sectional view of the NOR-type nonvolatile memory.

An example of an AND-type non-volatile memory is shown here in FIG. 25 to FIG. 27 as a comparative example. FIG. 25 shows a plan view of the semiconductor memory device, FIG. 26 shows an equivalent circuit diagram thereof, and FIG. 27 shows a schematic cross-sectional view of one memory cell thereof.

As shown in FIG. 25 and FIG. 26, in the AND-type non-volatile memory of the comparative example, word lines (WL1 to WL4) and bit lines (BL1 to BL6) are formed in a matrix form such that a floating gate 201 in a memory cell extends over two bit lines.

Further, as shown in the schematic cross-sectional view in FIG. 27, in the non-volatile memory of the comparative example, the floating gate 201 is formed above a Si substrate 202 through a silicon oxide film ($SiO_2$) 205. This floating gate 201 is disposed above a source 203 and a drain 204 to inject and draw electrons to and from the source 203 and the drain 204.

In the non-volatile memory having only one floating gate 201 for programming one memory cell 200 as described above, it is necessary to attain microfabrication by forming the floating gate 201 in a three-dimensional structure or the like in order to increase its integration, but there is a limit thereon and there is a disadvantage that fabrication process becomes complicated as well.

As has been described, in the semiconductor memory device of this embodiment, the floating gate 27 is provided in the form of two separated parts in one memory cell 40, thereby allowing each of the floating gates 27a and 27b to be individually programmable. As a result, the integration can be doubled in the same memory cell as compared to the comparative example in which a single floating gate is provided.

According to the present invention, since a floating gate is provided in the form of two separated parts in one memory cell, each of the parts can be individually programmable, so that the integration can be doubled in the same memory cell as compared to the case in which a single floating gate is provided.

Further, according to another characteristic of the present invention, diffusion layers are provided with other diffusion layers having the opposite conduction type thereto at the peripheries thereof, so that measures can be taken against a punch through.

Furthermore, according to still another characteristic of the present invention, a bit line is formed of a diffusion layer, so that a contact can be minimized and the area of a memory cell can also be reduced.

What is claimed is:

1. A semiconductor memory device, comprising:

a semiconductor substrate;

a pair of diffusion layers formed, with a certain distance therebetween, in a surface of said semiconductor substrate;

a first gate insulating film formed on said semiconductor substrate;

a pair of floating gates formed, on said first gate insulating film, separately above said diffusion layers respectively;

a second gate insulating film formed to cover said first gate insulating film and said floating gates, including a concave portion between said pair of floating gates; and a control gate formed on said second gate insulating film, a memory cell being constituted for every said pair of floating gates, wherein said first gate insulating film is formed such that a portion thereof between said floating gates is thicker than portions thereof on said diffusion layers.

2. The semiconductor memory device according to claim 1, wherein peripheries of said diffusion layers are covered with diffusion layers having an opposite conductivity type to those of said diffusion layers.

3. The semiconductor memory device according to claim 1, wherein said diffusion layers are bit lines and disposed to cross said control gate at right angles.

4. The semiconductor memory device according to claim 1, wherein said floating gates are formed to project upward.

* * * * *